US010644198B2

(12) United States Patent
Nakanishi

(10) Patent No.: US 10,644,198 B2
(45) Date of Patent: May 5, 2020

(54) LIGHT-EMITTING ELEMENT, LIGHT-EMITTING ELEMENT ARRAY, EXPOSURE HEAD, AND IMAGE FORMATION APPARATUS

(71) Applicant: CANON KABUSHIKI KAISHA, Tokyo (JP)

(72) Inventor: Koichiro Nakanishi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/688,593

(22) Filed: Aug. 28, 2017

(65) Prior Publication Data
US 2018/0062041 A1 Mar. 1, 2018

(30) Foreign Application Priority Data

Aug. 29, 2016 (JP) .................. 2016-167342
Dec. 7, 2016 (JP) .................. 2016-237689
Dec. 27, 2016 (JP) .................. 2016-254359
Jul. 25, 2017 (JP) .................. 2017-143688

(51) Int. Cl.
*H01L 29/74* (2006.01)
*H01L 33/30* (2010.01)
*B41J 2/455* (2006.01)
*H01L 33/14* (2010.01)
*H04N 1/036* (2006.01)
*H01L 33/00* (2010.01)
*G03G 15/04* (2006.01)

(52) U.S. Cl.
CPC .............. *H01L 33/30* (2013.01); *B41J 2/455* (2013.01); *G03G 15/04045* (2013.01); *H01L 33/0016* (2013.01); *H01L 33/14* (2013.01); *H04N 1/036* (2013.01); *G03G 15/04054* (2013.01)

(58) Field of Classification Search
CPC ........... H01L 27/0817; H01L 29/66386; H01L 29/7432; H01L 29/74
See application file for complete search history.

(56) References Cited

U.S. PATENT DOCUMENTS

2010/0047947 A1* 2/2010 Yashima ................ H01S 5/223
438/40
2011/0037093 A1* 2/2011 Murata .................. H01L 33/40
257/99
2013/0234167 A1* 9/2013 Kinoshita ................ B41J 2/45
257/88

FOREIGN PATENT DOCUMENTS

JP 2013-58789 A 3/2013

* cited by examiner

*Primary Examiner* — Jae Lee
(74) *Attorney, Agent, or Firm* — Canon U.S.A. Inc., IP Division

(57) ABSTRACT

A light-emitting element includes, on a substrate, a shift thyristor and a light-emitting thyristor. The shift thyristor and the light-emitting thyristor each include a semiconductor multilayer structure consisting of first to fourth semiconductor layers stacked with alternating conductivity types. The shift thyristor includes a current diffusion layer in contact with the semiconductor multilayer structure, and a first metal electrode in this order, or the first metal electrode which is in contact with the semiconductor multilayer structure on the semiconductor multilayer structure; and wherein in the shift thyristor, a region in which a region in which the current diffusion layer or the first metal electrode and the semiconductor multilayer structure come into contact with each other is projected in a stacked direction of the semiconductor multilayer structure is included in a region in which the first metal electrode is projected in the stacked direction.

17 Claims, 13 Drawing Sheets

FIG. 2A
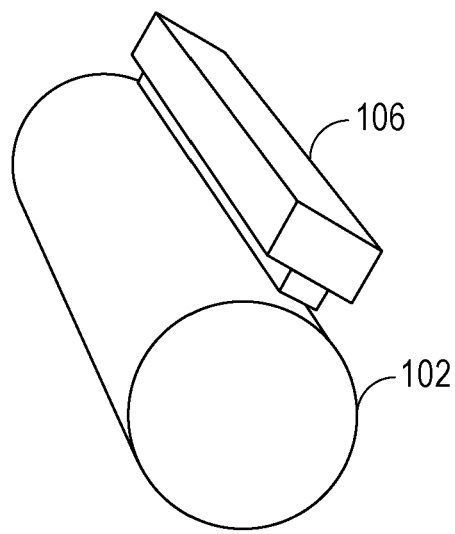
FIG. 2B
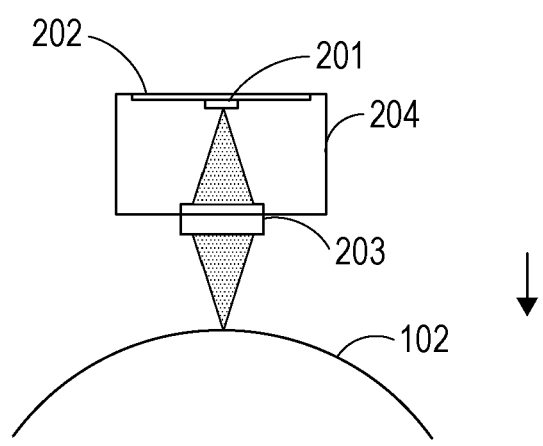
 LIGHT BEAM

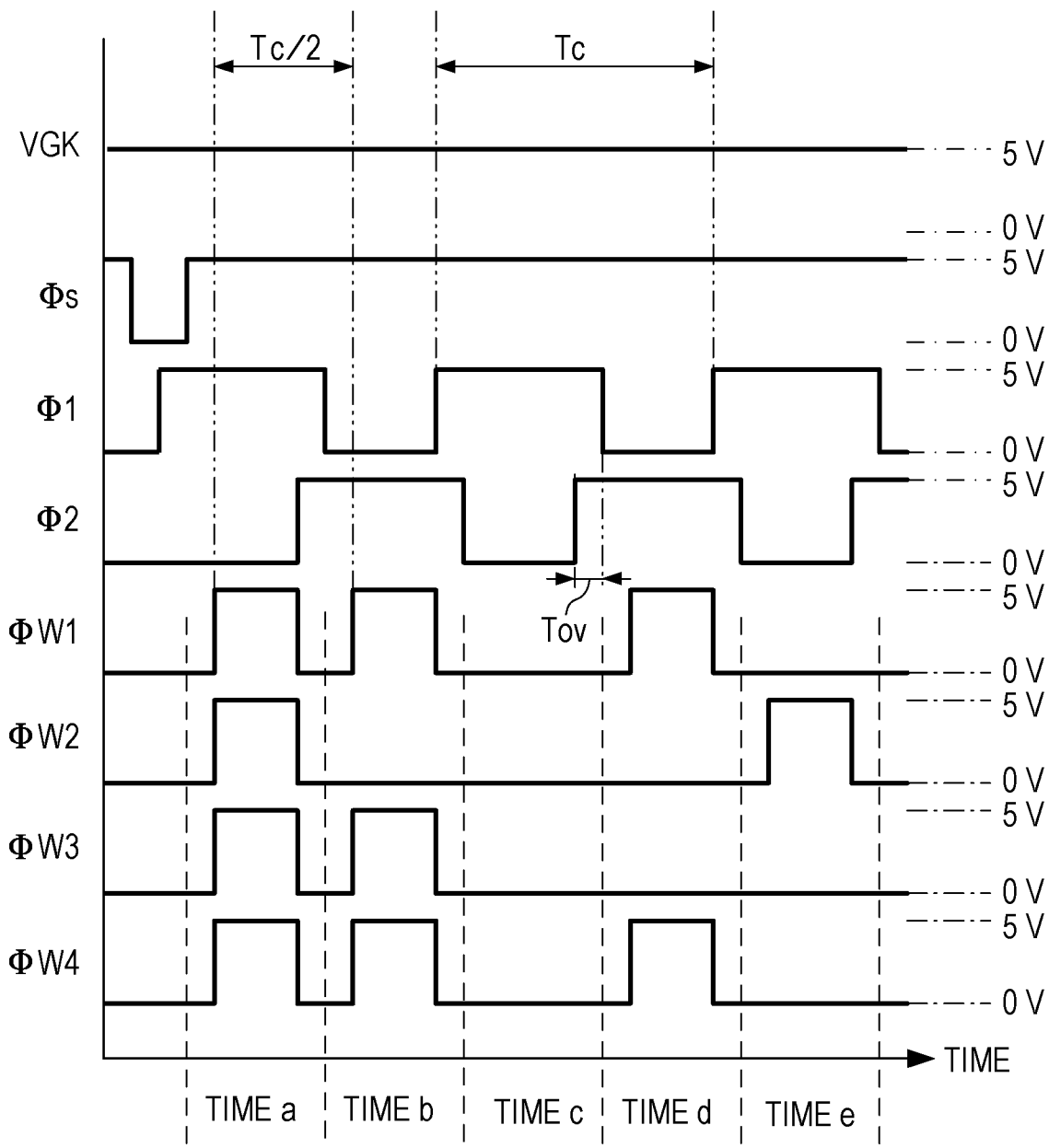

LIGHT-EMITTING ELEMENT, LIGHT-EMITTING ELEMENT ARRAY, EXPOSURE HEAD, AND IMAGE FORMATION APPARATUS

BACKGROUND OF THE INVENTION

Field of the Invention

The present disclosure relates to a light-emitting element, a light-emitting element array, an exposure head, and an image formation apparatus.

Description of the Related Art

An example of electrophotographic printers uses an exposure head to expose a photoconductor drum and form a latent image. The exposure head includes a light-emitting element array in which semiconductor light-emitting elements, such as light-emitting diodes (LED), are arranged in a longitudinal direction of a photoconductor drum, and a rod lens array which focuses light emitted from the light-emitting element array on the photoconductor drum. A printer employing an exposure head is attracting attention because of the advantages that reduction in size is easy, for example, as compared with a printer employing a laser scanning system in which deflection scanning is conducted using a laser beam with a polygon mirror.

An example of the light-emitting element array is a self-scanning light-emitting thyristor array. The self-scanning light-emitting thyristor array includes a shift thyristor in which thyristors are arranged unidimensionally as switch elements, and a light-emitting thyristor in which thyristors are arranged unidimensionally as light-emitting elements, which are integrated on the same substrate.

Japanese Patent Laid-Open No. 2013-58789 describes providing a current confinement mechanism in each light-emitting thyristor by oxidizing a part of a semiconductor layer in a self-scanning light-emitting thyristor array. This configuration concentrates a current on a part of the light-emitting thyristor, and improves light output power as compared with a case where no current confinement mechanism is provided.

The light-emitting element array of Japanese Patent Laid-Open No. 2013-58789 will be described with reference to FIGS. 11A to 11C. FIG. 11A is a simplified plan view of a part of the light-emitting element array of Japanese Patent Laid-Open No. 2013-58789. The light-emitting element array of Japanese Patent Laid-Open No. 2013-58789 includes a light-emitting thyristor L as a light-emitting element, a shift thyristor T, a parasitic thyristor P, and a common gate G of each thyristor. These are formed on a single mesa 1010 which has side surfaces 1 to 4.

FIG. 11B is a cross-sectional view of the shift thyristor T along line XIB-XIB of FIG. 11A. The shift thyristor T has a pn-pn thyristor structure in which a p-AlGaAs layer 1001, a p-AlGaAs layer 1002 (Al composition: about 0.98), a p-AlGaAs layer 1003, an n-AlGaAs layer 1004, a p-AlGaAs layer 1005, and an n-AlGaAs layer 1006 are stacked in this order on a p-GaAs substrate 1000. The p-AlGaAs layers 1001, 1002, and 1003 are considered to be anodes, the n-AlGaAs layer 1004 is considered to be an n gate, the p-AlGaAs layer 1005 is considered to be a p gate, and the n-AlGaAs layer 1006 is considered to be a cathode. The shift thyristor T includes a cathode electrode 1007 disposed on a front surface (the n-AlGaAs layer 1006), and an anode electrode 1009 disposed on a back surface.

The p-AlGaAs layer 1002 is partially oxidized and has high resistance at the oxidized portion. That is, the p-AlGaAs layer 1002 has oxidized regions 1002A and a non-oxidized region 1002B. The mesa 1010 is formed so that the p-AlGaAs layer 1002 is exposed, and the mesa 1010 is oxidized from side surfaces 1 to 4 of the mesa 1010. Then, the oxidized regions 1002A are formed. Then, the non-oxidized region 1002B which is substantially the same in shape with the mesa 1010 is formed inside of the mesa 1010. Although it depends on the crystal orientation of the mesa 1010, a depth to which oxidization is conducted from the side surfaces 1 to 4 is equally the width d if the four side surfaces 1 to 4 of the mesa 1010 have equivalent crystal orientation. In this manner, the non-oxidized region 1002B is formed so as to be surrounded by the oxidized region 1002A of the width d from the side surfaces 1 to 4 of the mesa 1010. Since resistance of the oxidized region 1002A is higher than resistance of the non-oxidized region 1002B, if a current is made to flow in a stacked direction of semiconductor, the current substantially flows through the non-oxidized region 1002B with concentration. With this configuration, a region which can emit light is limited to the non-oxidized region 1002B.

FIG. 11C is a cross-sectional view along line XIC-XIC of FIG. 11A including the light-emitting thyristor L and the shift thyristor T. As described above, the shift thyristor T and the light-emitting thyristor L are the same in semiconductor layer configuration. When both of these thyristors are turned on, a current flows between the anode and the cathode (in a stacked direction of the semiconductor), and a region of the multilayer structure in which the current flows emits light.

A light-emitting element array as a light source of an exposure head needs to have high contrast as the entire light-emitting element array in order to form a sharp and high definition image. That is, it is needed that when the light-emitting element is turned on, there is no light emission from elements other than the light-emitting element, or it is needed that light emission from the light-emitting element is sufficiently larger than light emission from elements other than the light-emitting element.

SUMMARY OF THE INVENTION

An aspect of an embodiment is a light-emitting element which includes, on a substrate, a shift thyristor and a light-emitting thyristor which is selected and becomes capable of emitting light by the shift thyristor, wherein the shift thyristor and the light-emitting thyristor each include a semiconductor multilayer structure including a first semiconductor layer of a first conductivity type, a second semiconductor layer of a second conductivity type which is different from the first conductivity type, a third semiconductor layer of the first conductivity type, and a fourth semiconductor layer of the second conductivity type in this order from the substrate side; wherein the shift thyristor includes a current diffusion layer which is in contact with the semiconductor multilayer structure, and a first metal electrode in this order, or the first metal electrode which is in contact with the semiconductor multilayer structure on the semiconductor multilayer structure; and wherein in the shift thyristor, a region in which a region in which the current diffusion layer or the first metal electrode and the semiconductor multilayer structure come into contact with each other is projected in a stacked direction of the semiconductor multilayer structure is included in a region in which the first metal electrode is projected in the stacked direction.

Further features of the present disclosure will become apparent from the following description of exemplary embodiments with reference to the attached drawings.

BRIEF DESCRIPTION OF THE DRAWINGS

FIG. 2A is a schematic perspective view illustrating a configuration of an exposure head according to a fifth embodiment.

FIG. 2B is a schematic cross-sectional view illustrating the configuration of the exposure head according to the fifth embodiment.

FIG. 9 illustrates driving signal waveforms of the self-scanning light-emitting circuit of the light-emitting element array of the first embodiment.

DESCRIPTION OF THE EMBODIMENTS

As described above, a self-scanning light-emitting element array includes a light-emitting thyristor L and a shift thyristor T on the same compound semiconductor substrate from the viewpoint of degree of integration, and so forth, and the light-emitting thyristor L and the shift thyristor T include a common multilayer structure. Therefore, when the shift thyristor T is made to operate, a light-emitting region in the shift thyristor T emits light.

In Japanese Patent Laid-Open No. 2013-58789, the non-oxidized region 1002B is rectangular (elongated in an X direction) in accordance with the shape of the mesa 1010. Therefore, in the shift thyristor T, a portion corresponding to the non-oxidized region 1002B in a Y direction is substantially covered with the cathode electrode 1007, whereas a portion which is not covered with the cathode electrode 1007 exists in the X direction. Therefore, light is generated from the portion which is not covered with the cathode electrode 1007 in the shift thyristor T and, as a result, contrast of the light-emitting element array may be lowered.

The present disclosure reduces light emission from elements other than a light-emitting thyristor as a light-emitting element as compared with a related art technology.

Hereinafter, embodiments of the present disclosure will be described in detail. The present disclosure is not limited to the following embodiments. Modification and improvement made to the following embodiments without departing from the scope of the present disclosure based on common knowledge of the person of ordinary skill in the art are also included in the scope of the present disclosure.

First Embodiment

Configuration of Light-Emitting Element Array

Figure 1A:
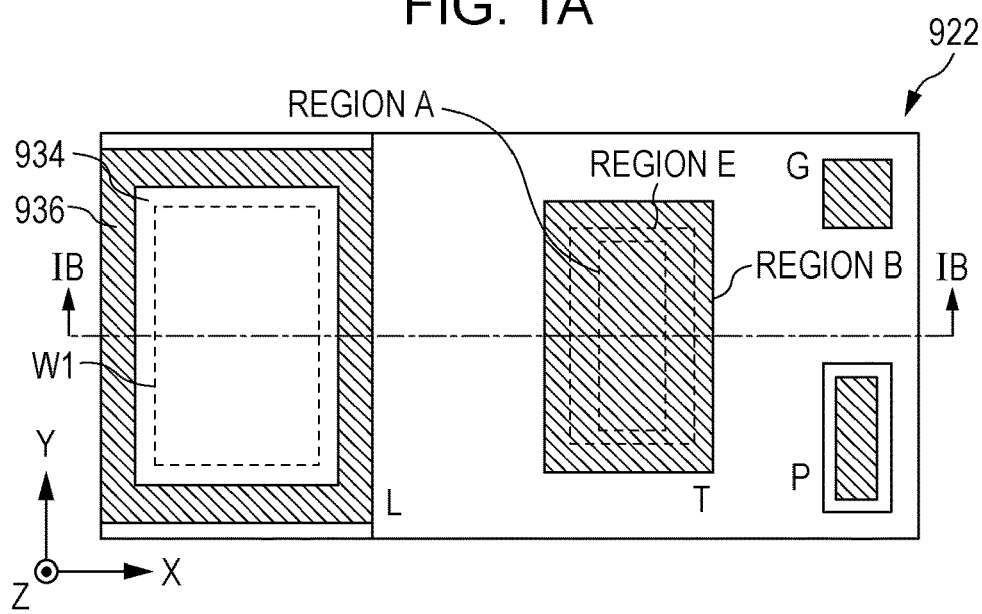
FIG. 1A schematically illustrates a part of a configuration of a light-emitting element array according to a first embodiment.
Figure 1B:
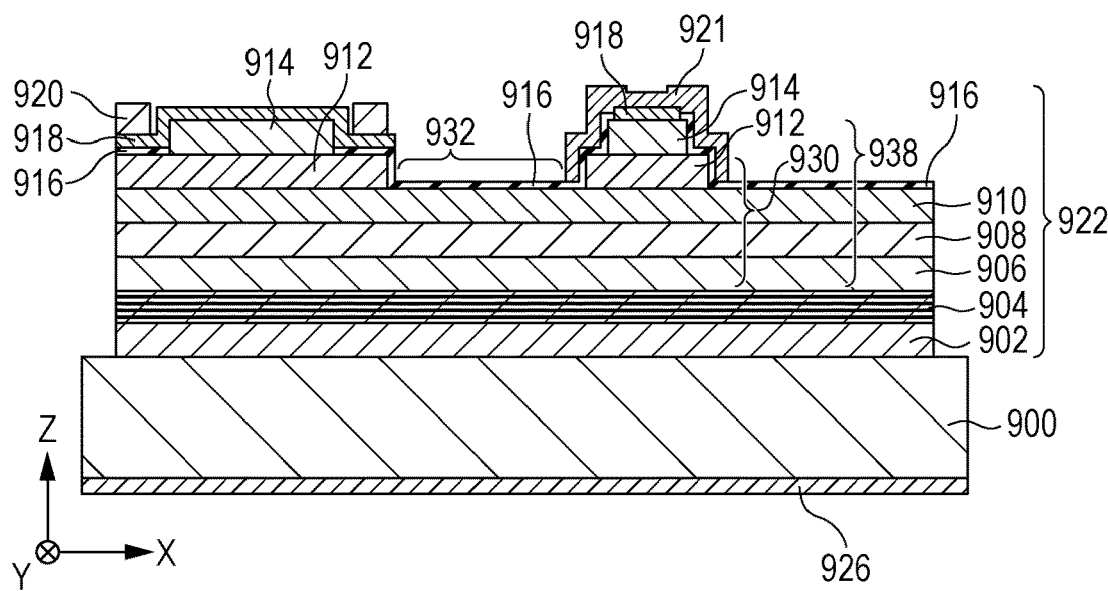
FIG. 1B is a cross-sectional view along line IB-IB of FIG. 1A.
Figure 1C:
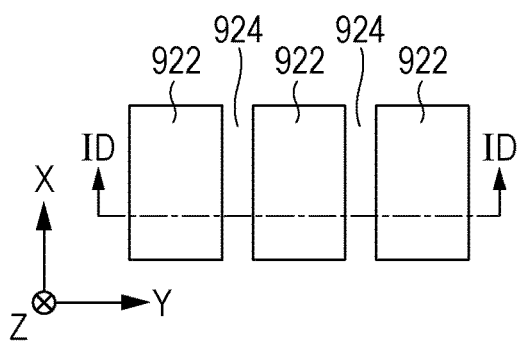
FIG. 1C is a schematic plan view of the light-emitting element array according to the first embodiment.
Figure 1D:
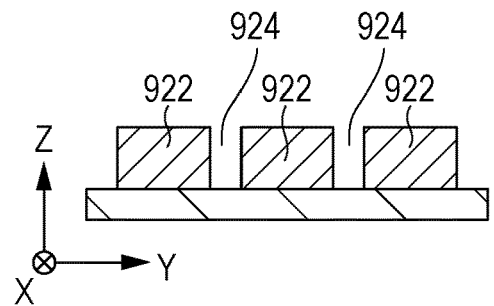
FIG. 1D is a cross-sectional view of FIG. 1C along line ID-ID.

A configuration of a light-emitting element array including a light-emitting element according to a first embodiment will be described with reference to FIGS. 1A to 1D. FIG. 1A is a plan view schematically illustrating a part of a configuration of the light-emitting element array of the present embodiment, and FIG. 1B is a cross-sectional view along line IB-IB of FIG. 1A. FIG. 1C is a schematic plan view of the light-emitting element array according to the present embodiment, and is a plan view of a light-emitting element array in which a plurality of light-emitting elements 922 including a light-emitting thyristor L is arranged unidimensionally. FIG. 1D is a cross-sectional view along line ID-ID of FIG. 1C. In the following description, a direction in which the light-emitting thyristor L and the shift thyristor T are arranged is defined as an X direction, a stacked direction of a semiconductor layer of the shift thyristor T is defined as a Z direction, and a direction orthogonal to the X direction and the Z direction is defined as a Y direction.

The light-emitting element array of the present embodiment includes a plurality of light-emitting elements, and in which the light-emitting thyristors L provided in the light-emitting element is arranged unidimensionally. Although the light-emitting thyristors L are arranged unidimensionally in the light-emitting element array in the present embodiment, the present disclosure is not limited to the same. The present disclosure is also applicable to a light-emitting element array in which the light-emitting thyristors L are arranged two-dimensionally. The present disclosure is also applicable to a lighting apparatus, a display apparatus, and a display including a light-emitting element array in which the light-emitting thyristors L are arranged two-dimensionally.

The light-emitting element array of the present embodiment has a plurality of light-emitting elements 922 on a substrate 900 as illustrated in FIG. 1D. In each light-emitting element 922, the light-emitting thyristor L and the shift thyristor T are formed. A plurality of light-emitting elements 922, each of which has a mesa structure, is separated by element separation grooves 924. A plurality of light-emitting elements 922 is disposed at a predetermined pitch (a distance between centers). For example, if a light-emitting element density of the light-emitting element array is set to 1200 dpi, a pitch between a plurality of light-emitting elements 922 is set to about 21.16 μm.

In the present embodiment, the light-emitting thyristor L and the shift thyristor T are provided in a single mesa and a gate G is shared by the light-emitting thyristor L and the shift thyristor T, however, the configuration is not limited to the same. The light-emitting thyristor L and the shift thyristor T may be provided in different mesas. In that case, the gate G may be provided in each mesa and the gates G may be connected by using a wire.

The light-emitting element array of the present embodiment includes a parasitic thyristor P, a gate electrode G, the shift thyristor T, and the light-emitting thyristor L. The light-emitting element array according to the present embodiment includes a cathode electrode (a back electrode) 926 disposed so as to face the light-emitting element 922 via the substrate 900.

A configuration of the light-emitting thyristor L and a configuration of the shift thyristor T will be described with reference to FIG. 1B. The light-emitting thyristor L and the shift thyristor T include a buffer layer 902, a distribution Bragg reflector layer 904, and a multilayer structure 930 in this order from the substrate side (the substrate 900 side) on the substrate 900. The distribution Bragg reflector layer 904 is hereinafter referred to as a DBR layer. As will be described in detail later, a plurality of semiconductor layers is stacked with alternate conductivity types in the multilayer structure 930.

In the present embodiment, each semiconductor layer constituting the light-emitting element 922 is desirably formed by a group III-V semiconductor. Examples of the group III-V semiconductor may desirably include a GaAs-based material, an AlGaAs-based material, a GaP-based material, a GaAsP-based material, an InP-based material, an AlAs-based material, and an AlGaInP-based material. Among these, each semiconductor layer constituting the light-emitting element 922 desirably includes a GaAs-based material and an AlGaAs-based material from the viewpoint of a light emission wavelength.

The substrate 900 is a semiconductor substrate of a first conductivity type. The substrate 900 may be made of GaAs, InP, GaP, and so forth.

The buffer layer 902 is a semiconductor layer of the first conductivity type which is the same conductivity type as that of the substrate 900. The buffer layer 902 is desirably formed by a semiconductor of the same base material as that of the substrate and, for example, if the substrate 900 is a GaAs substrate, GaAs or AlGaAs may be used.

The DBR layer 904 reflects light emitted from the light-emitting thyristor L toward the front surface of the substrate 900. The DBR layer 904 is formed by alternately stacking two types of different semiconductor layers of first conductivity type. The two different types of semiconductor layers which constitute the DBR layer may be AlGaAs of high concentration Al composition (for example, Al composition: 0.8) and AlGaAs of low concentration Al composition (for example, Al composition: 0.1).

The multilayer structure 930 is a thyristor in which a plurality of semiconductor layers of different conductivity types is disposed alternately. In the multilayer structure 930, a first semiconductor layer 906, a second semiconductor layer 908, a third semiconductor layer 910, and a fourth semiconductor layer 912 are stacked in this order from the substrate side (the substrate 900 side). The first semiconductor layer 906 and the third semiconductor layer 910 are of the first conductivity type, and the second semiconductor layer 908 and the fourth semiconductor layer 912 are of a second conductivity type which is different from the first conductivity type. That is, in the multilayer structure 930, a plurality of semiconductor layers is stacked, and the fourth semiconductor layer 912 of the second conductivity type is the uppermost layer among a plurality of semiconductor layers.

The multilayer structure 930 according to the present embodiment has a thyristor structure in which four semiconductor layers (a pnpn structure or an npnp structure) are stacked as described above. When the first conductivity type is n type, the second conductivity type is p type. The multilayer structure 930 is a thyristor which includes an n-type semiconductor layer, a p-type semiconductor layer, an n-type semiconductor layer, and a p-type semiconductor layer in this order from the substrate side (the substrate 900 side). If the first conductivity type is p type, the second conductivity type is n type. The multilayer structure 930 is a thyristor which includes a p-type semiconductor layer, an n-type semiconductor layer, a p-type semiconductor layer, and an n-type semiconductor layer in this order from the substrate side (the substrate 900 side). The first semiconductor layer 906 is an anode or a cathode of the thyristor, and the second semiconductor layer 908 is a gate of the thyristor. The third semiconductor layer 910 is a gate of the thyristor, and the fourth semiconductor layer 912 is a cathode or an anode of the thyristor.

In the light-emitting element 922, the fourth semiconductor layer 912 is separated between the light-emitting thyristor L and the shift thyristor T. In the present embodiment, the fourth semiconductor layer 912 is electrically separated by a separation groove 932 formed between the light-emitting thyristor L and the shift thyristor T. In the present embodiment, the light-emitting thyristor L has the island-shaped fourth semiconductor layer 912 and the shift thyristor T has the island-shaped fourth semiconductor layer 912, independently. In the present embodiment, the light-emitting thyristor L and the shift thyristor T share the buffer layer 902, the DBR layer 904, the first semiconductor layer 906, the second semiconductor layer 908, and the third semiconductor layer 910.

Light Emitting Thyristor L

The light-emitting thyristor L includes a light extraction region 934 and a current supply region 936. The current supply region 936 is a portion of the light-emitting thyristor L in which a second metal electrode 920 exists when the light-emitting thyristor L is seen from the opposite side of the substrate 900. Since a frame-shaped electrode is used as the second metal electrode 920 in the present embodiment, no metal electrode exists at the center of the second metal electrode 920. A portion of the light-emitting thyristor L in which the center of the second metal electrode 920 exists (a portion in which no metal electrode exists) when the light-emitting thyristor L is seen from the opposite side of the substrate 900 is the light extraction region 934. In the present embodiment, a current is supplied to the light-emitting thyristor L from an external circuit via the second metal electrode 920 which exists above the current supply region 936. In the light-emitting thyristor L, light is emitted from the light extraction region 934.

In the present embodiment, an n-type GaAs substrate is used as the substrate 900 and an n-type GaAs layer or an n-type AlGaAs layer is used as the buffer layer 902. A multilayer structure of an n-type AlGaAs layer of high Al composition and an n-type AlGaAs layer of low Al composition is used as the DBR layer 904. On the DBR layer 904, an n-type AlGaAs layer is used as the first semiconductor layer 906, a p-type AlGaAs layer is used as the second semiconductor layer 908, an n-type AlGaAs layer is used as the third semiconductor layer 910, and a p-type AlGaAs layer is used as the fourth semiconductor layer 912. A p-type GaP layer is used as a fifth semiconductor layer 914, and an n-type ITO layer is used as a transparent electrode layer 918. A p-type AlGaAs layer may be used as the fifth semiconductor layer 914. In the following description, the "first semiconductor layer 906" may be referred to as the "n-type AlGaAs layer 906," for example, using a compound name, however, the material and the configuration of each layer are not limited to the same.

The fifth semiconductor layer 914 is of the second conductivity type which is the same as that of the fourth semiconductor layer 912, whereas different in composition from that of the fourth semiconductor layer 912. The fifth semiconductor layer 914 desirably is transparent to a light emission wavelength, and is able to form high quality crystal on the fourth semiconductor layer 912. The fifth semiconductor layer 914 is disposed in contact with the fourth semiconductor layer 912.

In the light-emitting thyristor L according to the present embodiment, as illustrated in FIG. 1B, the p-type GaP layer which is the fifth semiconductor layer 914 is further formed on the p-type AlGaAs layer which is the fourth semiconductor layer 912 in the light extraction region 934. An n-type transparent conductive oxide layer which is the transparent electrode layer 918 is formed on the fifth semiconductor layer 914. Here, the n-type ITO layer is used as the n-type transparent conductive oxide layer. That is, the light-emitting thyristor L according to the present embodiment includes the fifth semiconductor layer 914 of the second conductivity type and the transparent electrode layer 918 of the first conductivity type in this order on the fourth semiconductor layer 912 of the second conductivity type (on the fourth semiconductor layer) in the light extraction region 934. That is, the light-emitting thyristor L includes the fifth semiconductor layer 914 which is in contact with the multilayer structure 930, and the transparent electrode layer 918 on the multilayer structure 930 in this order in the light extraction region 934. Hereinafter, a multilayer structure which includes the multilayer structure 930 and the fifth semiconductor layer 914 will be referred to as a semiconductor multilayer structure 938. The semiconductor multilayer structure 938 is constituted by a plurality of semiconductor layers, and each semiconductor layer constituting the semiconductor multilayer structure 938 is formed of a low conductive material.

The transparent electrode layer 918 is transparent with respect to the light emission wavelength of the light-emitting thyristor L and is formed by a highly electroconductive material. Here, "transparent with respect to the light emission wavelength of the light-emitting thyristor L" indicates that transmittance of light of a center wavelength λ emitted by the light-emitting thyristor L is equal to or greater than 70%. Regarding a thickness of the transparent electrode layer 918, an optical length in the Z direction of the transparent electrode layer 918 desirably is an odd multiple ±10% of λ/4. By setting the thickness of the transparent electrode layer 918 as described above, reflection of the light emitted from the light-emitting thyristor L on the transparent electrode layer 918 is reduced and light extraction efficiency is increased.

The material of the transparent electrode layer 918 is not particularly limited, however, a transparent conductive oxide (TCO) is desirably used. Examples of the transparent conductive oxide may include an indium oxide-based material having an n-type electrical conductivity, such as an indium tin oxide-based material (ITO), an indium zinc oxide-based material (IZO), and an indium tungsten oxide-based material (IWO), a zinc oxide-based material, such as an aluminum zinc oxide-based material (AZO) and a zinc gallium oxide-based material (GZO), and a tin oxide-based material. If the first conductivity type is p type, a nickel oxide-based material, and a copper oxide-based material, and so forth having p-type electrical conductivity may be used as transparent conductive oxide.

In the present embodiment, impurity concentration of the p-type GaP layer 914 at at least a portion in contact with the n-type ITO layer 918 is sufficiently high. That is, the p-type GaP layer which is the fifth semiconductor layer 914 has a region in which impurity concentration is sufficiently high on a surface in contact with the n-type ITO layer 918 or the vicinity thereof. That is, the fifth semiconductor layer 914 is a contact layer. In this specification, "impurity concentration is sufficiently high" about the p-type GaP layer 914 indicates that impurity concentration is so high that the p-type GaP layer 914 and the n-type ITO layer 918 can form a tunnel junction. "Impurity concentration is sufficiently high" about the p-type GaP layer 914 indicates, for example, that impurity concentration is equal to or greater than $1.5 \times 10^{19}$ cm$^{-3}$ and equal to or less than $2 \times 10^{20}$ cm$^{-3}$. The fifth semiconductor layer 914 and the transparent electrode layer have formed a tunnel junction. The "vicinity" here indicates that a distance from a contact surface is greater than 0 nm and equal to or less than 20 nm, for example.

If the p-type GaP layer 914 and the n-type ITO layer 918 do not form a tunnel junction, a current flows when a positive voltage is applied to the p-type GaP layer 914 and a negative voltage is applied to the n-type ITO layer 918, whereas no current flows when a positive voltage is applied to the n-type ITO layer 918 and a negative voltage is applied to the p-type GaP layer 914. However, when the p-type GaP layer 914 and the n-type ITO layer 918 have formed a tunnel junction, a current flows when a bias voltage in either of the directions is applied. Therefore, whether the p-type GaP layer 914 and the n-type ITO layer 918 have formed a tunnel junction is recognizable by checking that, when the bias voltages in two directions are applied to an integrated body of the p-type GaP layer 914 and the n-type ITO layer 918, the current flows when the bias voltages in either of the directions is applied.

All of the layers constituting the semiconductor multilayer structure 938 are semiconductor layers, and resistivity of each layer of the semiconductor multilayer structure 938 is higher than that of the n-type ITO layer 918. Each layer constituting the semiconductor multilayer structure 938 is small in size in the Z direction (the thickness) compared with the size in the X direction or the Y direction. Therefore, in the present embodiment, a career implanted into the semiconductor multilayer structure 938 from a portion in contact with the n-type ITO layer 918 flows in the Z direction without substantially diffused in the X direction or the Y direction.

In the light-emitting thyristor L according to the present embodiment, as illustrated in FIG. 1B, an interlayer insulating layer 916 is formed on the p-type AlGaAs layer which is the fourth semiconductor layer 912 in the current supply region 936. The n-type ITO layer which is the transparent electrode layer 918, and the second metal electrode 920 are formed on the interlayer insulating layer 916. That is, the light-emitting thyristor L according to the present embodiment includes the interlayer insulating layer 916, the transparent electrode layer 918 of the first conductivity type, and the second metal electrode 920 in this order on the fourth semiconductor layer 912 of the second conductivity type (on the fourth semiconductor layer) in the current supply region 936.

A current which flows into the n-type ITO layer 918 from the second metal electrode 920 in the current supply region 936 flows through the n-type ITO layer 918, and diffuses in a direction horizontal to the substrate 900. Since the n-type ITO layer 918 is electrically connected to the light extraction region 934 and the current supply region 936, the n-type ITO layer 918 can guide the current which has flowed into the n-type ITO layer in the current supply region 936 to the n-type ITO layer 918 of the light extraction region 934.

That is, the n-type ITO layer 918 can function as a current diffusion layer which diffuses the current in the direction horizontal to the substrate 930. In the present embodiment, by providing the n-type ITO layer 918 in this way, the current supplied from the second metal electrode 920 can be diffused toward the center of the light-emitting thyristor without lowering resistance of each semiconductor layer which constitutes the multilayer structure 930.

Here, when a suitable forward bias voltage is applied to the light-emitting thyristor L (for example, a back electrode 926 is grounded and a positive voltage is applied to the second electrode 920), a current flows into the back electrode 926 from the second electrode 920 in the light extraction region 934 because the p-type AlGaP layer 914 and the n-type ITO layer 918 have formed a tunnel junction. That is, in the light extraction region 934, the current flows into the back electrode 926 which is a cathode electrode from the second electrode 920 which is an anode electrode. In the current supply region 936, the interlayer insulating layer 916 is formed between the p-type AlGaAs layer 912 and the n-type ITO layer 918. Therefore, in the current supply region 936, flowing of the current into the back electrode 926 which is a cathode electrode from the second electrode 920 which is an anode electrode can be substantially suppressed.

In the light-emitting thyristor L according to the present embodiment, with this structure, a current can be flowed with concentration in a region in which the p-type GaP layer 914 which is a contact layer exists. That is, a current can be flowed with concentration through a portion in which the p-type GaP layer 914 and the n-type ITO layer 918 come into contact with each other in the light extraction region 934. That is, a current concentration region (a region W1) is formed at a portion in which the p-type GaP layer 914 and the n-type ITO layer 918 come into contact with each other. Since the n-type ITO layer 918 is substantially transparent with respect to the light emission wavelength of the light-emitting thyristor L, the light emitted within the semiconductor layer 930 penetrates the n-type ITO layer 918 and emitted to a surface opposite to the side of the substrate 900.

Figure 4A:
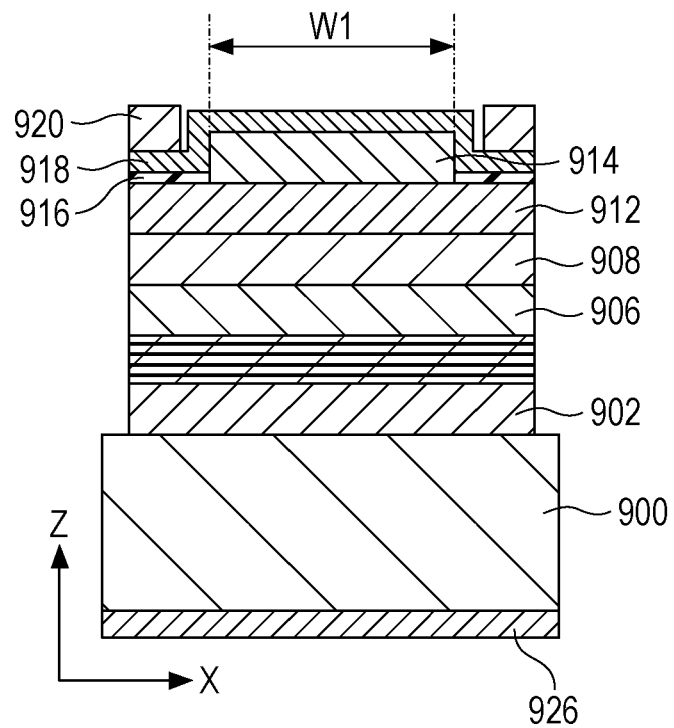
FIG. 4A is a cross-sectional view of a light-emitting thyristor according to the first embodiment.
Figure 4B:
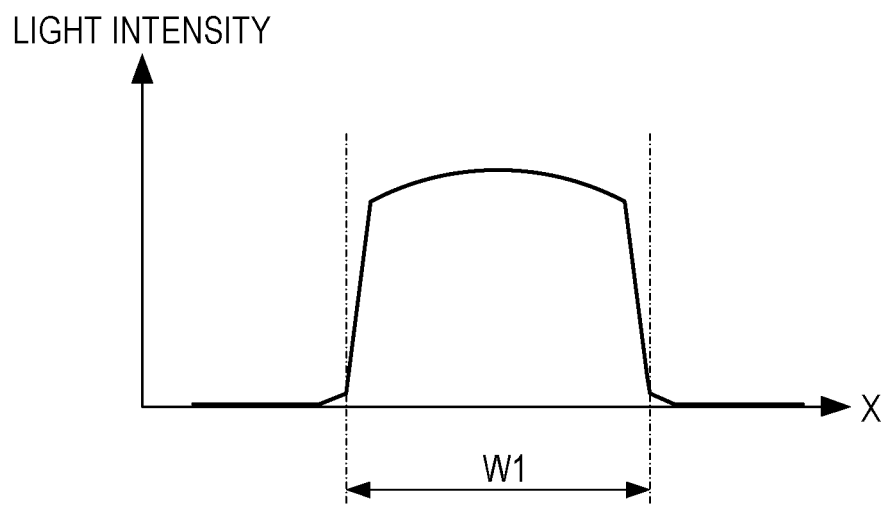
FIG. 4B illustrates light intensity distribution in the light-emitting thyristor according to the first embodiment.

The current concentration region will be described with reference to FIGS. 4A and 4B. FIG. 4A schematically illustrates a cross-sectional structure of the light-emitting thyristor L according to the present embodiment. FIG. 4B illustrates light intensity distribution in the X direction when the current is made to flow between the second electrode (an anode electrode) 920 and the back electrode (a cathode electrode) 926 to make the light-emitting thyristor L emit light.

As illustrated in FIG. 4B, light emission intensity is large in the region W1 in which the p-type GaP layer 914 and the n-type ITO layer 918 come into contact with each other, and is small and about 0 in an outside of the region W1. Light emission intensity distribution reflects current distribution within the light-emitting thyristor L, and the result indicates that the career implanted from the anode electrode 920 concentrates on the region W1, i.e., a portion at which the p-type GaP layer 914 and the n-type ITO layer 918 come into contact with each other. Therefore, the current concentration region in the light-emitting thyristor L can be defined as a region in which the p-type GaP layer 914 and n-type ITO layer 918 come into contact with each other. As described later, the shift thyristor T also has a region in which the p-type GaP layer 914 and the n-type ITO layer 918 come into contact with each other, and since the current flows through this region with concentration, the current concentration region in the shift thyristor T can be defined in the similar manner.

Shift Thyristor T

In the shift thyristor T according to the present embodiment, as illustrated in FIG. 1B, the p-type GaP layer which is the fifth semiconductor layer 914 is formed on the p-type AlGaAs layer which is the fourth semiconductor layer 912 in the same manner as in the light-emitting thyristor L. Further, an n-type transparent conductive oxide layer which is the transparent electrode layer 918 is formed on the fifth semiconductor layer 914, and the first metal electrode 921 is formed on the transparent electrode layer 918. That is, the shift thyristor T includes n-type ITO 918 which is the current diffusion layer in contact with the fifth semiconductor layer 914, and the first metal electrode 921 in this order on the semiconductor multilayer structure 938.

A material which constitutes the first metal electrode 921 may be the same as or different from a material which constitutes the second metal electrode 920. In the present embodiment, the first metal electrode 921 and the second metal electrode 920 are formed by the same material.

As illustrated in FIG. 1B, a region in which the n-type ITO layer 918 and the p-type GaP layer 914 of the shift thyristor T come into contact with each other may be included in a region in which the first metal electrode 921 of the shift thyristor T is formed. In particular, a region A in which the n-type ITO layer 918 and the p-type GaP layer 914 of the shift thyristor T come into contact with each other is projected in the Z direction from right above the substrate 900 may be included in a region B in which the first metal electrode 921 of the shift thyristor T is projected in the Z direction. The region A desirably exists inside of the region B. Here, "the region A exists inside of the region B" refers to a state where the region A is completely included in the region B, and the region A and the region B is not sharing a boundary line. That is, a region not in contact with the n-type ITO layer 918 exists so as to completely surround a periphery of the region A on a surface of the p-type GaP layer 914. If both the region A and the region B are rectangular in shape, the sides of the boundary line of the region A are located inside of the sides of the boundary line of the region B. In the shift thyristor T, the region in which the n-type ITO 918 which is a current diffusion layer and the semiconductor multilayer structure 938 come into contact with each other is desirably included in a plane of the uppermost layer of the semiconductor multilayer structure 938 on the side of the first metal electrode 921.

With this configuration, in the present embodiment, since the current concentration region is formed in the shift thyristor T, and the first metal electrode 921 is formed to surround the current concentration region, light emitted from the shift thyristor T can be blocked by the first metal electrode 921. Therefore, unnecessary light emission from the shift thyristor T can be reduced, and contrast of the light-emitting element array can be improved.

In the shift thyristor T, the region in which the p-type GaP layer 914 which is a contact layer and the p-type AlGaAs layer 912 come into contact with each other is desirably included on a surface (an upper surface) of the p-type AlGaAs layer 912 on the side of the first metal electrode 921. The region A described above is desirably included in a region E in which a surface (the upper surface) of the p-type AlGaAs layer 912 of the shift thyristor T on the side of the first metal electrode 921 is projected in the Z direction. With this configuration, reaching of the career implanted into the multilayer structure 930 from the p-type GaP layer 914 which is a contact layer at a side surface of the multilayer structure 930 can be suppressed. If the career reaches the side surface of the semiconductor layer in the multilayer structure 930, surface recombination may occur and operation stability of the shift thyristor may be decreased. If the region A is included in the region E as described above, reaching of the career at the side surface of the multilayer structure 930 can be suppressed, and stability of the characteristics of the shift thyristor can be improved.

Although the interlayer insulating layer 916 is provided between the n-type ITO layer 918 and the p-type AlGaAs layer 912 in the present embodiment, it is not necessary to provide the interlayer insulating layer 916. A reverse bias voltage is applied to an attached diode formed by the n-type ITO layer 918 and the p-type AlGaAs layer 912 whereas the forward bias voltage is applied to the light-emitting thyristor L. If reverse direction pressure resistance of the attached diode formed by the n-type ITO layer 918 and the p-type AlGaAs layer 912 is sufficient for usage, since a current basically does not flow except for the tunnel connecting portion when a forward bias voltage is applied, the interlayer insulating layer 916 may be omitted. Although a low concentration portion of the p-type GaP layer 914 may be left as described later, the attached diode is formed in the low concentration portion of the n-type ITO layer 918 and the p-type AGaP layer 914 in that case.

Manufacturing Method

An example of a manufacturing method of the light-emitting element array of the present embodiment will be described with reference to FIGS. 6A to 6F. FIGS. 6A to 6F are cross-sectional views for describing a manufacturing method of the light-emitting element array of the present embodiment. Here, an example where the first conductivity type is n type and the second conductivity type is p type will be described, however, the present disclosure is not limited to the same.

First, an n-type GaAs layer or an n-type AlGaAs layer as the buffer layer 902 is epitaxially grown on the substrate 900 including n-type GaAs. As the method of epitaxial growth, common growing methods of semiconductors, such as a molecular beam epitaxial method and an metalorganic chemical vapor deposition (MOCVD), can be used.

Next, as the DBR layer 904, the n-type AlGaAs layer of high Al composition and the n-type AlGaAs layer of low Al composition are alternately stacked so that an optical length of each layer may be $\lambda/4 \pm 10\%$. Regarding a combination of Al compositions in the DBR layer 904, the greater the difference in the Al composition ratio, the wider the reflection zone of the DBR layer 904 becomes, which is desirable. For example, a combination of the Al composition: 0.8 and the Al composition: 0.1 may be used appropriately. The greater the number of stacked semiconductor layers, the higher the reflectance becomes. Therefore, ten or more pairs of semiconductor layers are desirably stacked.

Next, the n-type AlGaAs layer 906, the p-type AlGaAs layer 908, the n-type AlGaAs layer 910, and the p-type AlGaAs layer 912 are sequentially grown to have a predetermined composition, impurity concentration, and thickness so as to form the multilayer structure 930. Further, the p-type GaP layer 914 is grown on the p-type AlGaAs layer 912, so as to form the multilayer structure 930. As the method of growth of each layer, common growing methods of semiconductors can be used as in the case of the buffer layer 902. The growing process of the buffer layer 902 to the p-type GaP layer 914 is desirably conducted continuously in the same growing apparatus from the viewpoint of crystal quality.

Figure 6A:
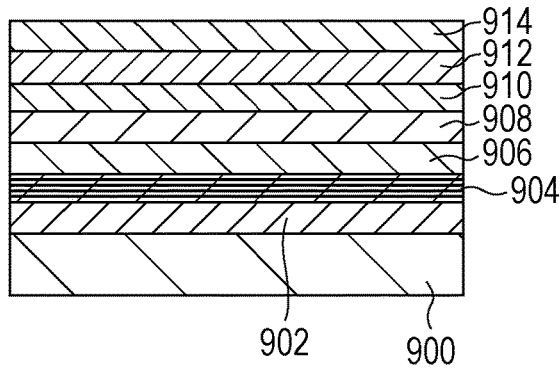
FIGS. 6A to 6F illustrate a manufacturing method of the light-emitting element array of the first embodiment.

Since the p-type GaP layer 914 forms a tunnel junction with the n-type ITO layer 918, it is desirable to increase impurity concentration as high as possible to such an extent that crystallinity is not impaired at least on the side coming into contact with the n-type ITO layer 918. A desirable range of impurity concentration is equal to or greater than $1.5 \times 10^{19}$ cm$^{-3}$ and equal to or less than $2 \times 10^{20}$ cm$^{-3}$, for example. A side of the p-type GaP layer 914 which comes into contact with the p-type AlGaAs layer 912 (a surface opposite to the surface which comes into contact with the n-type ITO layer 918) does not necessarily have to have such high in impurity concentration. FIG. 6A is a state until the p-type GaP layer 914 is formed by the method described above.

Figure 6B:
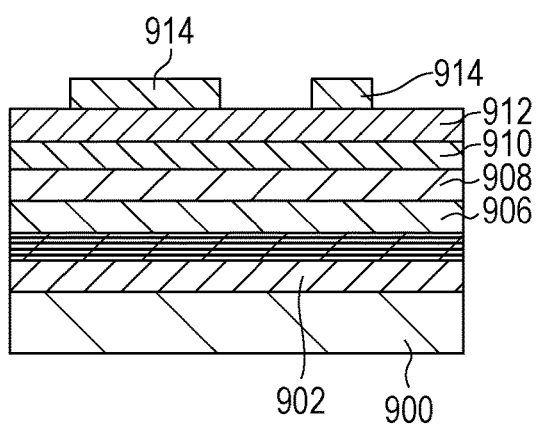

Next, the p-type GaP layer 914 is etched into a desired shape by a common semiconductor process as illustrated in FIG. 6B. In FIG. 6B, the p-type GaP layer 914 is etched to reach the p-type AlGaAs layer 912. However, this is not restrictive, and a part of the p-type GaP layer 914 may be left as long as a portion with high impurity concentration (a portion which forms a tunnel junction) is removed except for portions necessary in each thyristor in the p-type GaP layer 914 as illustrated in FIG. 10.

Figure 10:
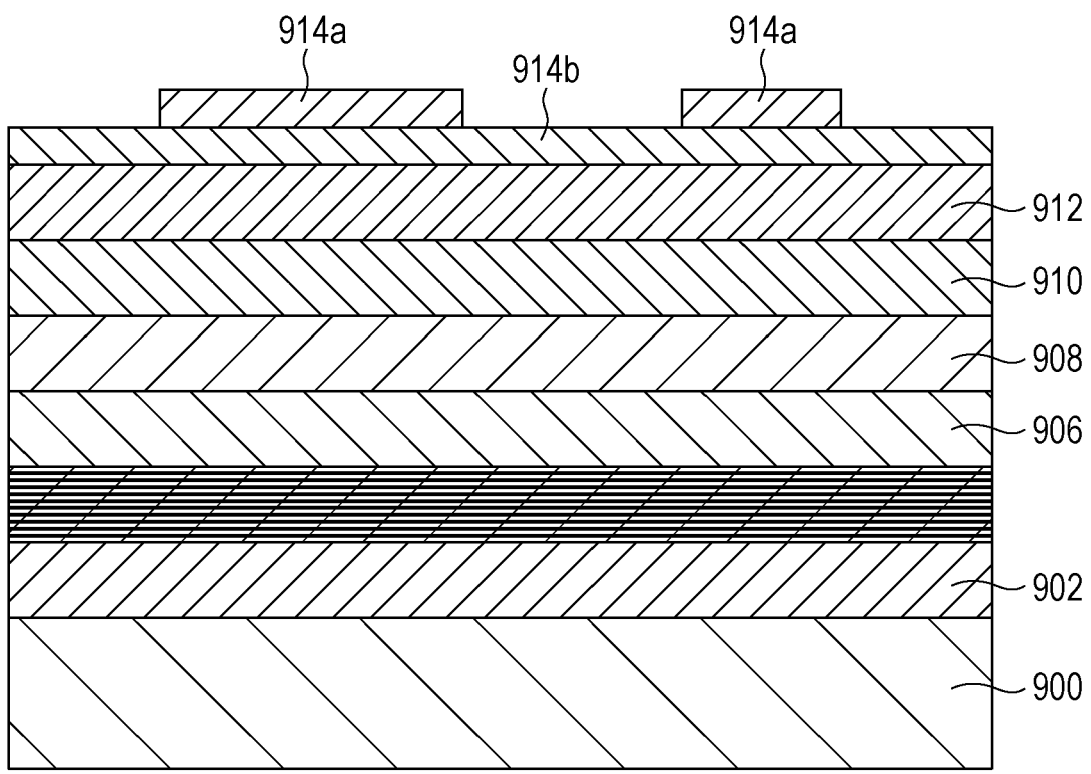
FIG. 10 schematically illustrates another example of a configuration of the light-emitting element array of the first embodiment.
Figure 11A:
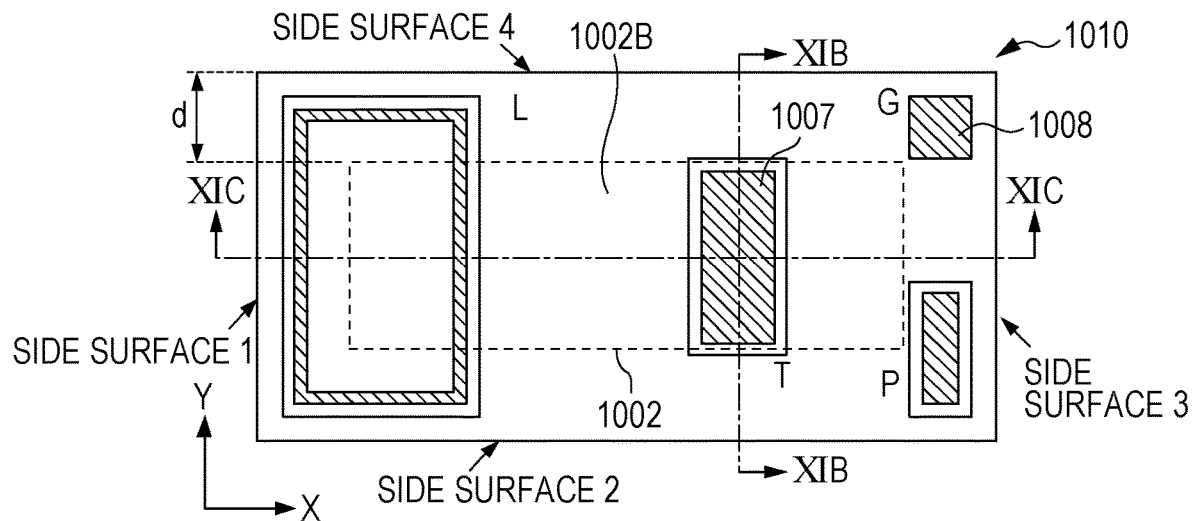
FIGS. 11A to 11C schematically illustrate a configuration of a related art light-emitting element array.
Figure 11B:
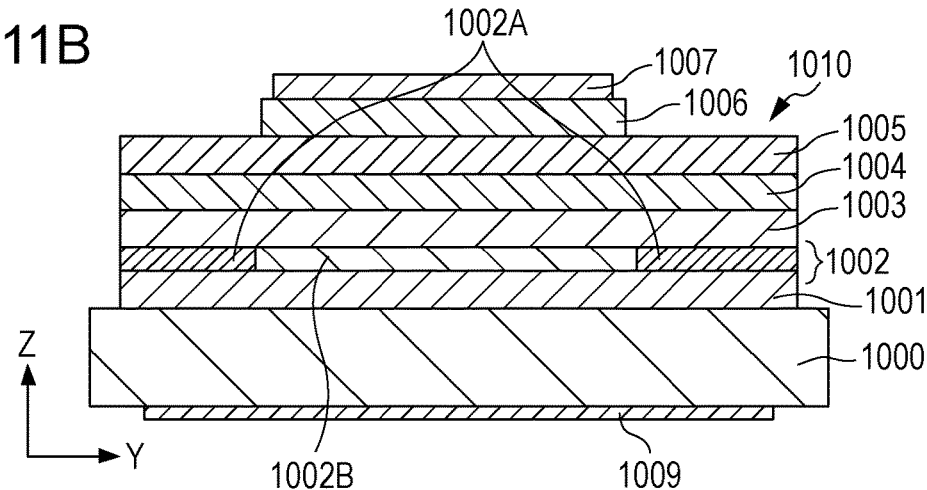
Figure 11C:
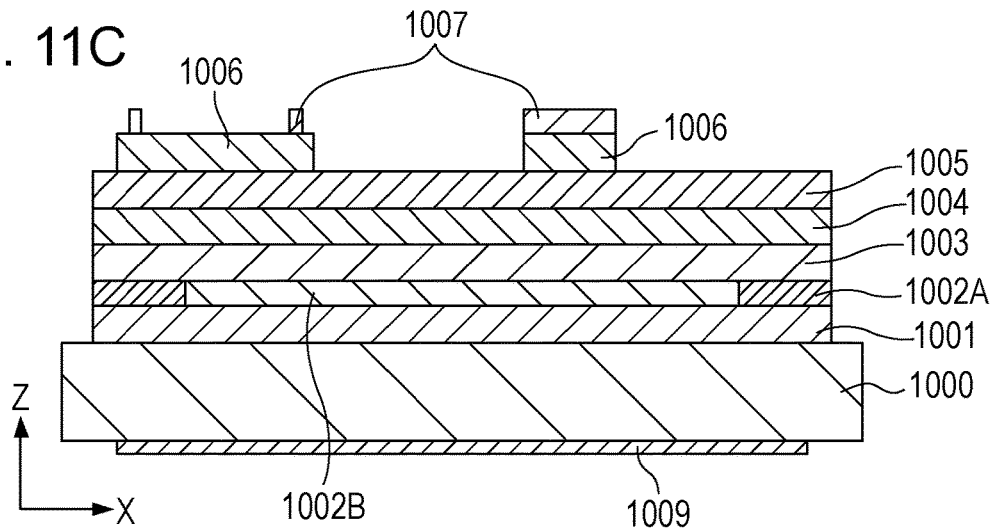

In FIG. 10, the p-type GaP layer 914 includes a semiconductor layer 914$a$ with high impurity concentration, and a semiconductor layer 914$b$ with low impurity concentration. In this case, a tunnel junction is formed when the n-type ITO layer 918 comes in contact with the semiconductor layer 924$a$ with high impurity concentration. Therefore, a portion with high impurity concentration (the semiconductor layer 914$a$) except for a portion in contact with the n-type ITO layer 918 is removed, and a portion with low impurity concentration (the semiconductor layer 914$b$) is left.

Figure 6C:
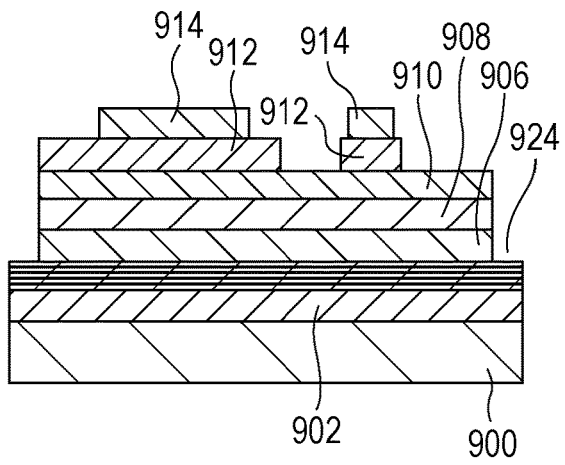

After etching, the p-type AlGaAs layer 912 which functions as an anode layer is etched into a desired shape as illustrated in FIG. 6C. Further, the p-type AlGaAs layer 912 is etched so that at least the p-type AlGaAs layer 908 is removed completely, and the element separation groove 924 is formed. In FIG. 6C, etching is conducted to reach a height of the n-type AlGaAs layer 906 as the element separation groove 924, however, etching may reliably be conducted to reach the p-type AlGaAs layer 908 as the element separation groove. The order of etching of the p-type GaP layer 914, the p-type AlGaAs layer 912, and the element separation groove 924 is illustrating only, and may be changed in accordance with the process, for example.

Figure 6D:
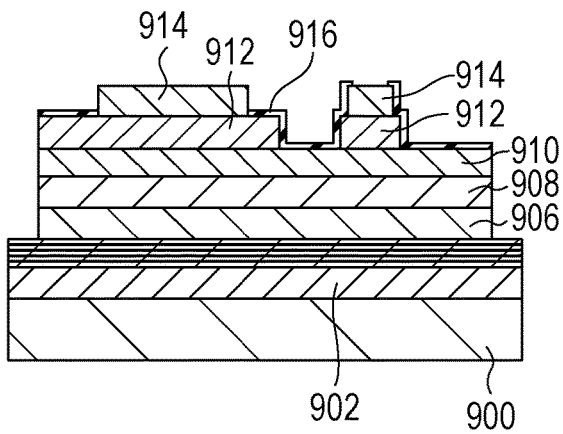

Next, the interlayer insulating layer 916 is formed and etched into a desired shape as illustrated in FIG. 6D. The interlayer insulating layer 916 can be made of SiO$_x$, SiN, and so forth by sputtering, chemical vapor deposition, and so forth. Although not illustrated by FIGS. 6A to 6F, the interlayer insulating layer 916 may be formed also on the side surfaces and a bottom surface of the element separation groove 924, and can protect the light-emitting element in that case.

Figure 6E:
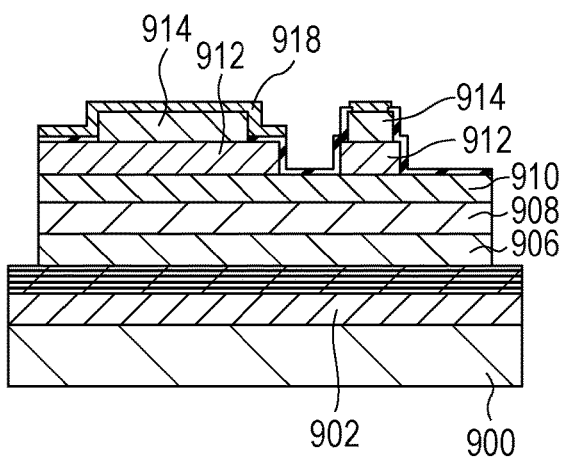

Next, as illustrated in FIG. 6E, the n-type ITO layer 918 is formed to a desired form by sputtering, vacuum deposition, spraying, and so forth. In the present embodiment, the n-type ITO layer 918 is formed by vacuum deposition so that the optical length of the thickness thereof becomes ¼ of an odd multiple ±10% of the light emission wavelength $\lambda$ ($\lambda/4$). As described above, by setting the optical length of the thickness of the n-type ITO layer 918 to $\lambda/4$ of an odd multiple ±10%, reflection of light on an interface between the n-type ITO layer 918 and air is reduced, and light extraction efficiency is improved.

Figure 6F:
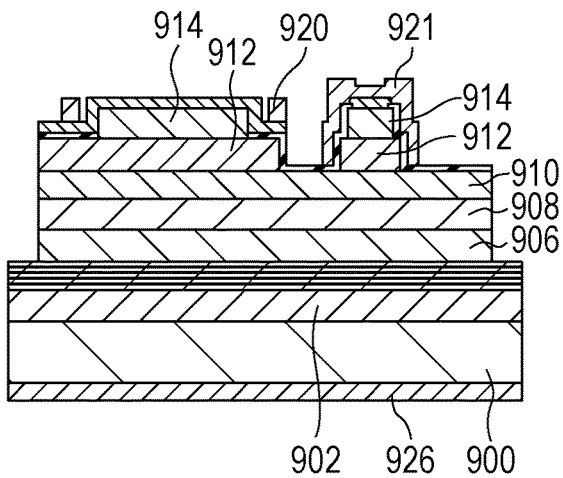

Then, as illustrated in FIG. 6F, the second metal electrode 920 is formed in the light-emitting thyristor L, and the first metal electrode 921 is formed in the shift thyristor T. Finally, AuGe/nickel/Au as the back electrode 926 is vapor-deposited on the back surface of the substrate 900 in this order in vacuum to conduct heat treatment. As the second metal electrode 920 and the first metal electrode 921, Cr and Au are vapor-deposited in this order in vacuum. A liftoff method is used as an electrode pattern forming method.

The material, the film deposition method, the etching method, and so forth in the manufacturing method described above are not limited to those described above, and may be selected suitably without departing from the scope of the present disclosure.

SLED Circuit

Figure 7:
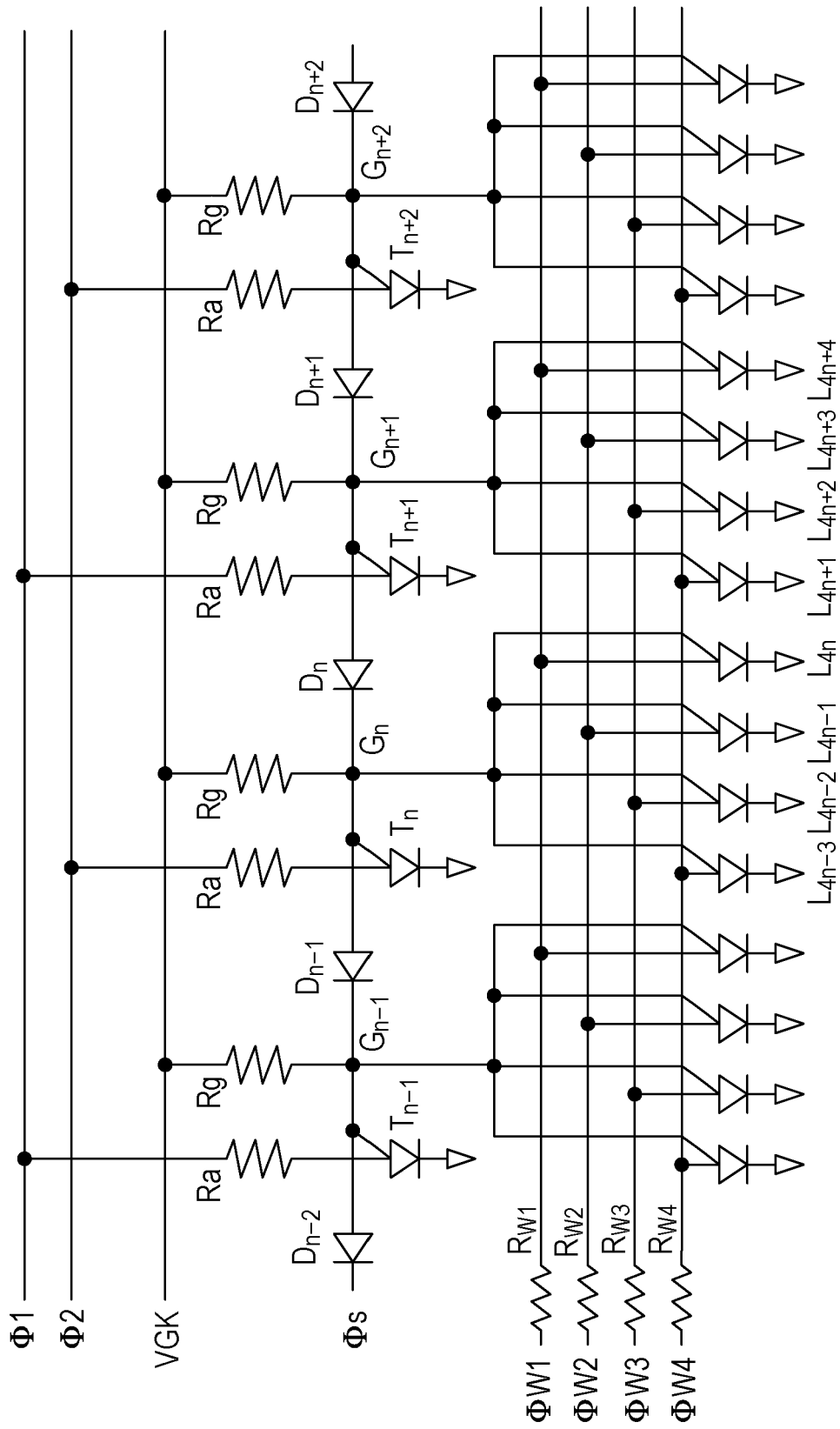
FIG. 7 is a schematic diagram of an equivalent circuit of a self-scanning light-emitting circuit of the light-emitting element array of the first embodiment.

FIG. 7 is a schematic diagram of a part of an equivalent circuit of a self-scanning light-emitting element array of the present embodiment. Although subscripts, such as n−1 and n, are attached to the reference symbols of each configuration in FIG. 7, the subscripts of the reference symbols may be omitted in common configurations in the following description. The subscript n is an integer of 2 or greater.

The light-emitting element array of the present embodiment includes a plurality of anode resistances Ra, a plurality of gate resistances Rg, a plurality of shift thyristors T, a plurality of transfer diodes d, and a plurality of light-emitting thyristors L. The light-emitting element array of the present embodiment further includes a common gate Gn of a plurality of shift thyristors T and the light-emitting thyristor L connected to the shift thyristors T.

The light-emitting element array includes a transfer line of odd-numbered shift thyristors Φ1, a transfer line of even-numbered shift thyristors Φ2, lighting signal lines of the light-emitting thyristors L ΦW1 to ΦW4, a gate line (VGK), and a start pulse line Φs. The lighting signal lines ΦW1 to ΦW4 are provided with resistances $R_{W1}$ to $R_{W4}$, respectively. As illustrated in FIG. 7, four light-emitting thyristors $L_{4n-3}$ to $L_{4n}$ are connected to a single shift thyristor $T_n$, so that four light-emitting elements can emit light simultaneously.

SLED Operation

Here, an operation of the equivalent circuit of FIG. 7 will be described. In the following description, a voltage of 5V is applied to the gate line VGK, and the same voltage of 5V is supplied to the transfer lines Φ1 and Φ2, and the lighting signal lines ΦW1 to ΦW4.

When the shift thyristor $T_n$ is on, the potential of the shift thyristor $T_n$ and the common gate Gn of the light-emitting thyristors $L_{4n-3}$ to $L_{4n}$ connected to the shift thyristor $T_n$ is reduced to about 0.2V. Since the common gate $G_n$ and a common gate $G_{n+1}$ are connected using a coupling diode $D_n$, a potential difference substantially equal to a diffusion potential of a coupling diode $D_n$ is generated.

Since the diffusion potential of the coupling diode $D_n$ is about 1.5V in the present embodiment, the potential of the common gate $G_{n+1}$ becomes 1.7V (the potential 0.2V of the common gate $G_n$+the diffusion potential 1.5V). In the same manner, a potential of a common gate $G_{n+2}$ is 3.2V and a potential of a common gate $G_{n+3}$ is 4.7V. However, since the potential of the gate line VGK is 5V, the potential of each common gate G cannot be 5V or greater, the potential of the common gate $G_{n+4}$ and thereafter is set to 5V. Regarding the potential of the gates before the common gate $G_n$ (the left side of FIG. 7), since a reverse bias voltage is applied to the coupling diode, the voltage of the gate line VGK is applied directly and the potential is 5V.

Figure 8A:
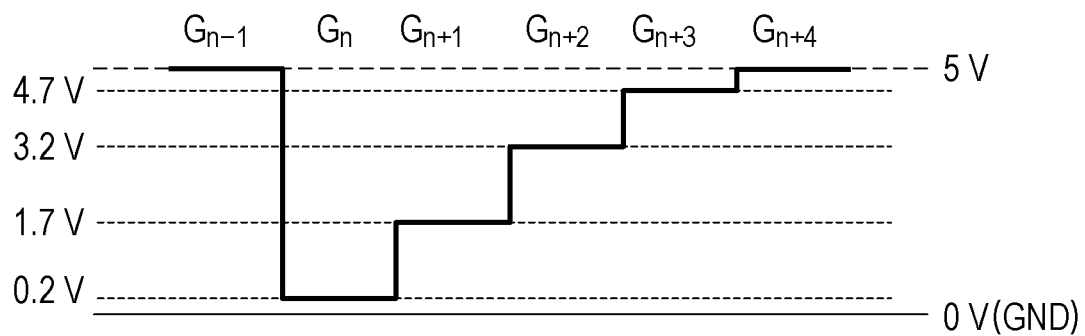
FIGS. 8A to 8C illustrate gate potential distribution of the self-scanning light-emitting circuit of the light-emitting element array of the first embodiment.

Distribution of the gate potential when the above-described shift thyristor $T_n$ is on is illustrated in FIG. 8A. A voltage necessary to turn each shift thyristor T on (hereinafter, referred to as a "threshold voltage") is substantially the same as each gate potential to which the diffusion potential is added. When the shift thyristor $T_n$ is on, the shift thyristor $T_{n+2}$ has the lowest gate potential in the shift thyristors connected to the same transfer line Φ1. Since the potential of the gate $G_{n+2}$ of the shift thyristor $T_{n+2}$ is 3.2V as described above, the threshold voltage of the shift thyristor $T_{n+2}$ is 4.7V.

However, since the shift thyristor $T_n$ is on, the potential of the transfer line Φ1 is set to about 1.5V (the diffusion potential), which is lower than the threshold voltage of the shift thyristor $T_{n+2}$, the shift thyristor $T_{n+2}$ cannot be turned on. Since the threshold voltages of all other shift thyristors connected to the same transfer line Φ1 are higher than the threshold voltage of the shift thyristor $T_{n+2}$, the shift thyristors cannot be turned on similarly, but only the shift thyristor $T_n$ can be kept the on state.

Figure 8B:
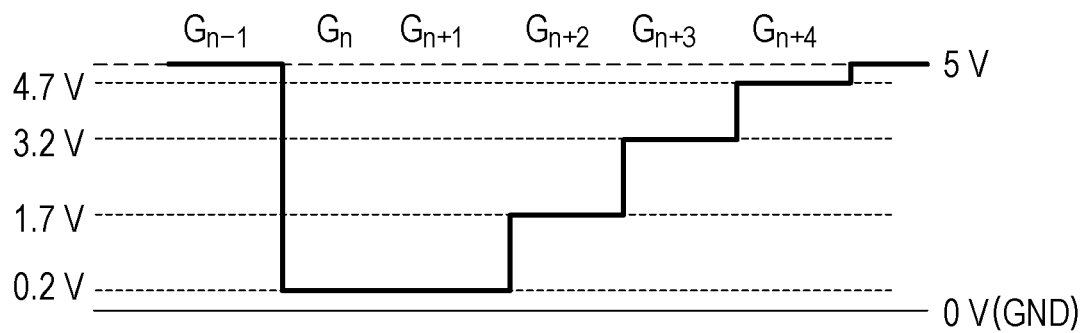

Regarding the shift thyristor connected to the transfer line Φ2, the threshold voltage of the shift thyristor $T_{n+1}$ with the lowest threshold voltage is 3.2V and the threshold voltage of the next lowest shift thyristor $T_{n+3}$ of the threshold voltage is 6.2V. When 5V is supplied to the transfer line Φ2 in this state, only the shift thyristor $T_{n+1}$ can be turned on. In this state, the shift thyristors $T_n$ and $T_{n+1}$ are simultaneously on, and the gate potentials of the shift thyristors located to the right of the shift thyristor $T_{n+1}$ are lowered by the diffusion potential. However, since the potential of the VGK is 5V and the gate voltage is limited by the VGK, the potentials of the shift thyristors located to the right of the shift thyristor $T_{n+5}$ are set to 5V. Gate voltage distribution at this time is illustrated in FIG. 8B.

Figure 8C:
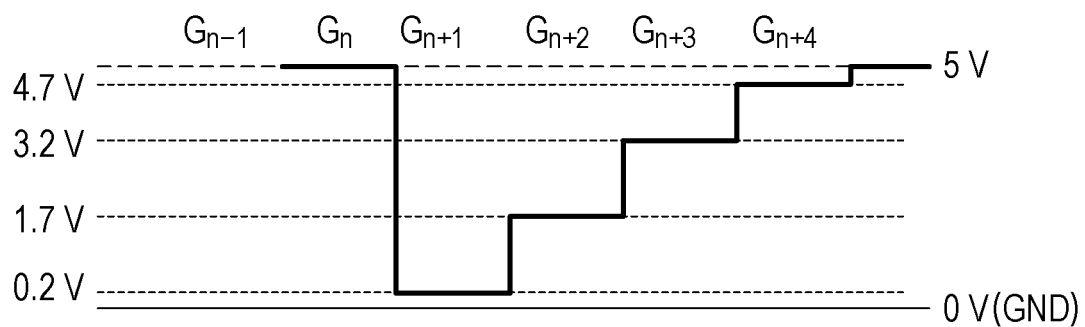

When the potential of Φ1 is lowered to 0V in this state, the shift thyristor $T_n$ is turned off and the potential of the gate $G_n$ increases to the VGK potential. Gate voltage distribution at this time is illustrated in FIG. 8C. In this manner, transfer of the on state from the shift thyristor $T_n$ to the shift thyristor $T_{n+1}$ is completed.

Next, a light emission operation of the light-emitting thyristor L will be described. When only the shift thyristor $T_n$ is on, since the four light-emitting thyristors $L_{4n-3}$ to $L_{4n}$ are connected to the common gate $G_n$ of the shift thyristor $T_n$, the gate potentials of the light-emitting thyristors $L_{4n-3}$ to $L_{4n}$ are 0.2V which is the same as the gate $G_n$. Therefore, the threshold voltage of each light-emitting thyristor L is 1.7V and, if a voltage equal to or greater than 1.7V is supplied from the lighting signal lines ΦW1 to ΦW4, each light-emitting thyristor L can be turned on. Therefore, by supplying the lighting signals to the lighting signal lines ΦW1 to ΦW4 when the shift thyristor $T_n$ is on, all the combinations of the four light-emitting thyristors $L_{4n-3}$ to $L_{4n}$ can selectively emit light. That is, the light-emitting thyristors $L_{4n-3}$ to $L_{4n}$ are selected by a corresponding shift thyristor $T_n$ and become capable of emitting light. At this time, the potential of the gate $G_{n+1}$ of the subsequent shift thyristor $T_{n+1}$ of the shift thyristor $T_n$ is 1.7V, and the threshold of each of light-emitting thyristors $L_{4n+1}$ to $L_{4n+4}$ connected to the common gate $G_{n+1}$ becomes 3.2V.

Since the lighting signals supplied from the lighting signal lines ΦW1 to ΦW4 are 5V, the light-emitting thyristors $L_{4n+1}$ to $L_{4n+4}$ also are likely to be turned on in the same lighting patterns as those of the light-emitting thyristors $L_{4n-3}$ to $L_{4n}$ However, since the threshold voltages of the light-emitting thyristors $L_{4n-3}$ to $L_{4n}$ are lower than those of the light-emitting thyristors $L_{4n+1}$ to $L_{4n+4}$ the light-emitting thyristors $L_{4n-3}$ to $L_{4n}$ are turned on earlier than the light-emitting thyristors $L_{4n+1}$ to $L_{4n+4}$ when the lighting signals are supplied. Once the light-emitting thyristors $L_{4n-3}$ to $L_{4n}$ are turned on, the connected lighting signal lines ΦW1 to ΦW4 are set to about 1.5 V (the diffusion potential), which is lower than the threshold voltage of the light-emitting thyristors $L_{4n+1}$ to $L_{4n+4}$. Therefore, the light-emitting thyristors $L_{4n+1}$ to $L_{4n+4}$ cannot be turned on. Thus, by connecting a plurality of light-emitting thyristors L to a single shift thyristor T, a plurality of light-emitting thyristors L can be turned on simultaneously.

FIG. 9 illustrates an example of a driving signal waveform. 5V is supplied to the VGK all the time. The clock signal for the odd-numbered shift thyristors Φ1 and the clock signal for the even-numbered shift thyristors Φ2 are applied in the same cycle Tc, and a signal for start Φs 5V is supplied. The signal for start Φs is dropped to 0V in order to generate a potential difference in the gate line immediately before the clock signal Φ1 first reaches 5V. Therefore, the gate of the first shift thyristor is set to 1.7V from 5V, the threshold voltage is set to 3.2V, and the shift thyristor can be turned on with the clock signal Φ1. 5V is applied to the clock signal Φ1, the first shift thyristor T is transitioned to the on state. Slightly thereafter, 5V is supplied to the signal Φs and 5V continuously supplied to the signal Φs thereafter. The clock signals Φ1 and Φ2 have lap time Tov in which their on states (here, 5V is supplied) overlap each other, and have a substantially complementary relationship. The signals for lighting the light-emitting thyristors ΦW1 to ΦW4 are transmitted with half a cycle of the cycle of the clock signals Φ1 and Φ2, and a corresponding shift thyristor T is turned on when 5V is applied when the corresponding shift thyristor T is on. For example, at time a, in a state where all of the four light-emitting thyristors L connected to the same shift thyristor T are on, and at time b, three light-emitting thyristors L are on simultaneously. At time c, all of the light-emitting thyristors L are off and, at time d, two light-emitting thyristors L are on simultaneously. At time e, one light-emitting thyristor L is on.

Although the number of the light-emitting thyristors L connected to a single shift thyristor T is four in the present embodiment, the number is not limited to the same. The number of the light-emitting thyristors L may be increased or decreased in accordance with the usage. Although a circuit in which a cathode of each thyristor is common is described above, a circuit in which an anode of each thyristor is common is also applicable by inverting polarity.

According to the light-emitting element array of the present embodiment, light emission from elements other than a light-emitting thyristor as a light-emitting element can be reduced as compared with a related art technology. Therefore, a high-contrast light-emitting element array can be provided.

Second Embodiment

Figure 5A:
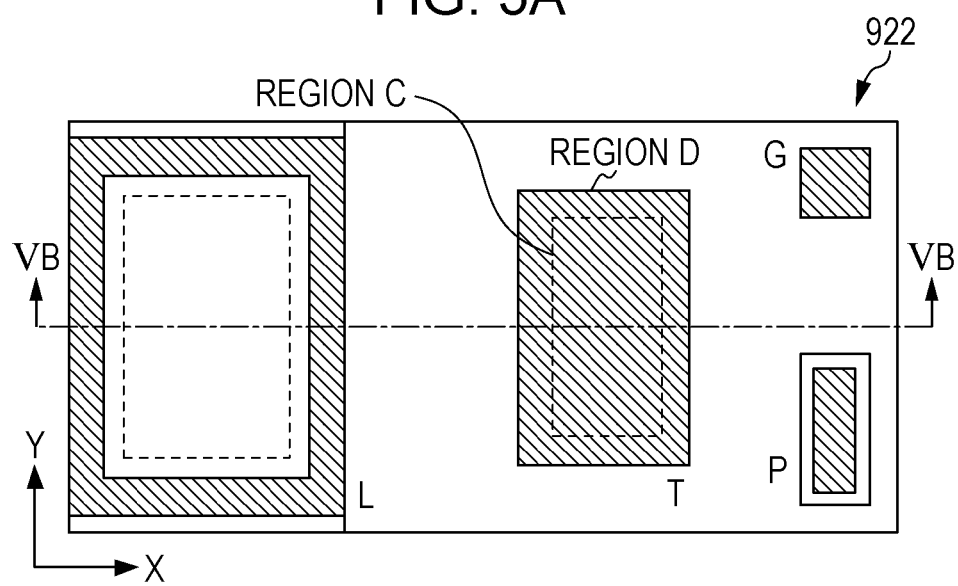
FIG. 5A schematically illustrates a part of a configuration of a light-emitting element array of a second embodiment.
Figure 5B:
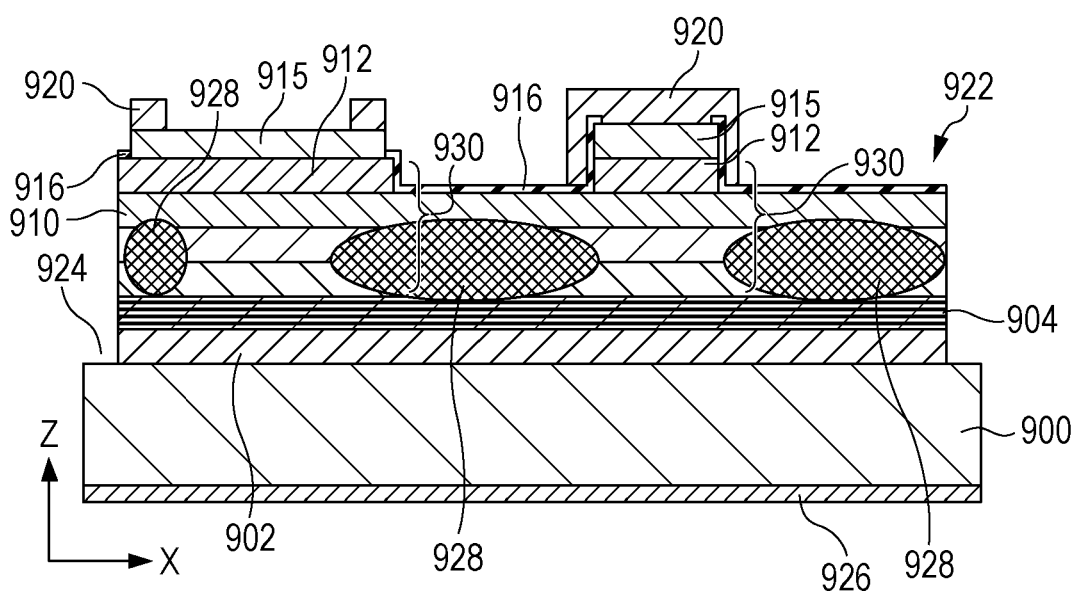
FIG. 5B is a cross-sectional view along line VB-VB of FIG. 5A.

A configuration of a light-emitting element array including a light-emitting element according to a second embodiment will be described with reference to FIGS. 5A and 5B. FIG. 5A is a plan view illustrating a part of a configuration of the light-emitting element array of the present embodiment, and FIG. 5B is a cross-sectional view along line VB-VB of FIG. 5A. In the present embodiment, the same configurations as those of the first embodiment are denoted by the same reference numerals in FIGS. 5A and 5B, and detailed description thereof is omitted.

In the present embodiment, a current concentration region is formed by providing a current confinement structure in at least one of semiconductor layers which constitute a multilayer structure 930. In particular, resistance of a desired region is increased by ion implantation at a part of the multilayer structure 930. In the present embodiment, in a shift thyristor T, a region C in which a first region surrounded by a high resistance region 928 is projected in a stacked direction (a Z direction) of the multilayer structure 930 may be included in a region D in which a metal electrode (an upper electrode) 920 is projected in the stacked direction. In the present embodiment, a portion surrounded by the high resistance region (a second region) 928 of which resistance is increased by ion implantation becomes the current concentration region. In the present embodiment, the "high resistance region" refers to a region having resistance of 100,000 or more times the resistance of a non-ion implantation region, such as the first region, for example.

As illustrated in FIG. 5B, the substrate 900 to the p-type AlGaAs layer 912 have the same configurations as those of the first embodiment. In the present embodiment, no p-type GaP layer 914 is disposed on the p-type AlGaAs layer 912, but a p-type AlGaAs layer as a current diffusion layer 915 is disposed on the p-type AlGaAs layer 912.

The current diffusion layer 915 has higher impurity concentration and lower resistance than the p-type AlGaAs layer 912 does. The current diffusion layer 915 desirably diffuses the current uniformly in an in-plane direction. In each of a light-emitting thyristor L and a shift thyristor T, the metal electrode 920 is formed above the current diffusion layer 915.

In the multilayer structure 930, a high resistance region 928 is formed by ion implantation. Although protons are used as ions to be implanted in the present embodiment, the type of ions is not limited to the same, and oxygen ions, boron ions, and so forth may be used.

As illustrated in the cross-sectional view along line VB-VB, the high resistance region 928 is formed so that the region in which the high resistance region 928 is projected from right above may come into contact with the entire periphery or overlap the region B in which a metal layer as the upper electrode 920 of the shift thyristor T is projected from right above. A region below the current diffusion layer 915 in the Z direction (the substrate 900) includes a region of which resistance is not increased (a first region). That is, the high resistance region 928 is disposed around the first region in a plan view. With this configuration, the region C which is disposed below the current diffusion layer 915 and in which the first region surrounded by the high resistance region 928 projected in the Z direction is included in the region D in which the metal layer as the upper electrode 920 is projected in the Z direction.

In the light-emitting thyristor L and the shift thyristor T, a current flowing between the upper electrode 920 and a back electrode 926 flows through regions other than this high resistance region 928. Therefore, in the shift thyristor T, the region surrounded by the high resistance region 928 becomes the current concentration region on which the current concentrates. Although there is a possibility that light is emitted from the current concentration region of the shift thyristor T, since the high resistance region 928 is formed so that the region C is included in the region D in the present embodiment, the current concentration region is disposed below the upper electrode 920. Therefore, light generated in the shift thyristor T is blocked by the upper electrode 920 in the same manner as in the first embodiment. In the present embodiment, since the region C is formed to be completely included in the region D, light emission from the shift thyristor T can be reduced as compared with a related art technology.

According to the light-emitting element array of the present embodiment, light emission from elements other than a light-emitting thyristor as a light-emitting element can be reduced as compared with a related art technology. Therefore, a high-contrast light-emitting element array can be provided.

Third Embodiment

Figure 12A:
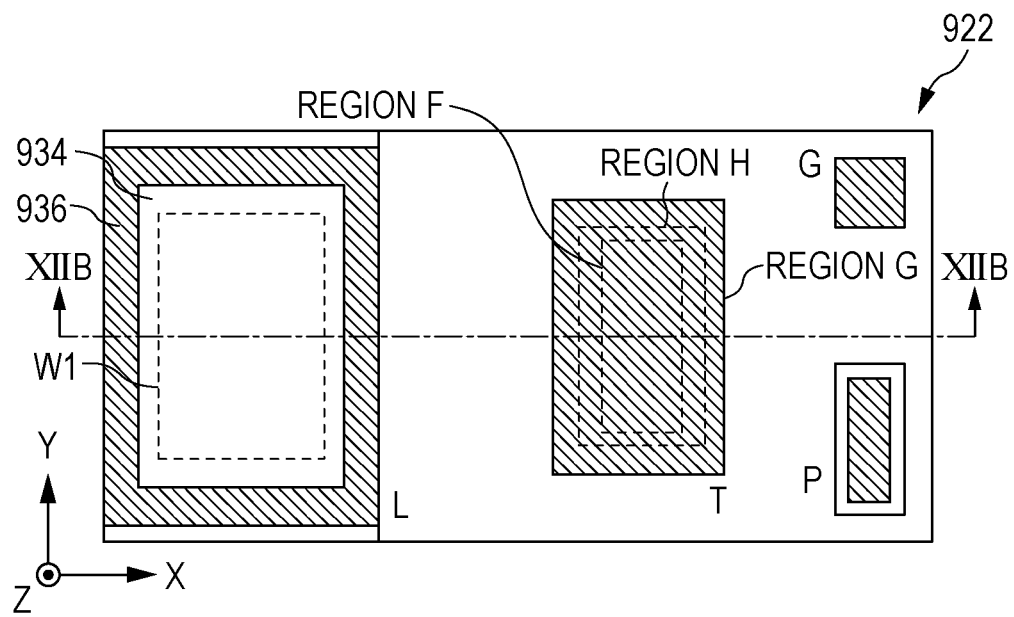
FIG. 12A schematically illustrates a part of a configuration of a light-emitting element array of a third embodiment.
Figure 12B:
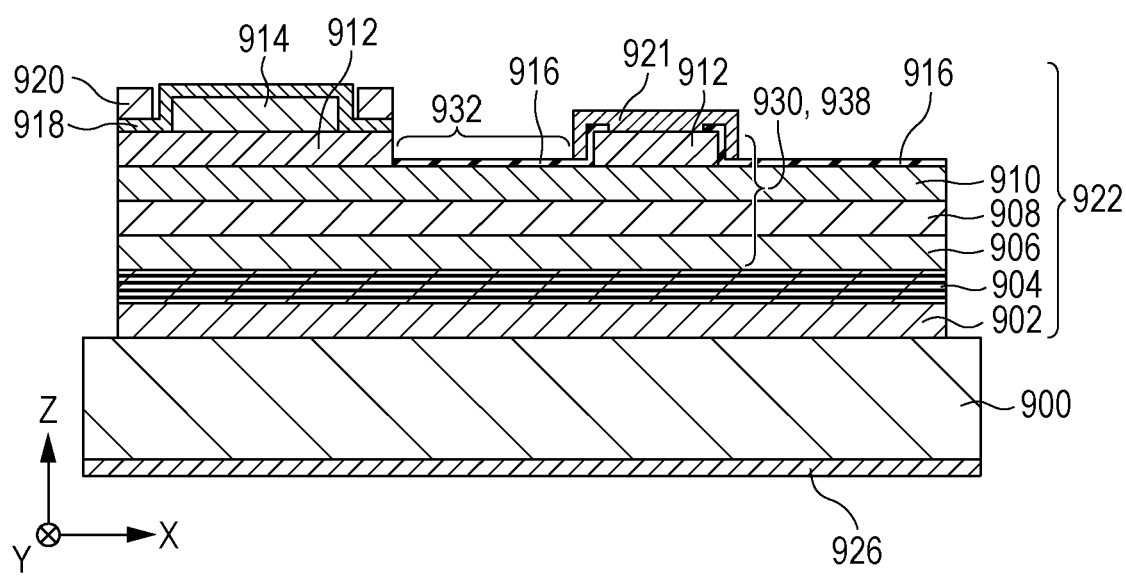
FIG. 12B is a cross-sectional view along line XIIB-XIIB of FIG. 12A.

A configuration of a light-emitting element array including a light-emitting element according to a third embodiment will be described with reference to FIGS. 12A and 12B. FIG. 12A is a plan view illustrating a part of a configuration of the light-emitting element array of the present embodiment, and FIG. 12B is a cross-sectional view along line XIIB-XIIB of FIG. 12A. In the present embodiment, the same configurations as those of the first embodiment are denoted by the same reference numerals in FIGS. 12A and 12B, and detailed description thereof is omitted.

The present embodiment differs from the first embodiment in that a first metal electrode 921 is formed directly above a multilayer structure 930 in a shift thyristor T. That is, in the present embodiment, a first metal electrode 921 in contact with a fourth semiconductor layer 912 is disposed on the multilayer structure 930. In the present embodiment, the semiconductor multilayer structure 938 is the multilayer structure 930.

In the present embodiment, the fourth semiconductor layer 912 and the first metal electrode 921 desirably come into ohmic contact with each other in the shift thyristor T. This can reduce a driving voltage of the shift thyristor T.

For example, in the shift thyristor T, when Cr and Au are vacuum-deposited in this order on a p-type AlGaAs layer 912 to form an electrode, a Schottky diode is formed between the electrode and the p-type AlGaAs layer 912. In this case, a driving voltage of the shift thyristor T is increased by an amount of a voltage drop of the Schottky diode. However, if AuZn is vacuum-deposited on the p-type AlGaAs layer 912 to form an electrode in the shift thyristor T, the electrode and the p-type AlGaAs layer 912 come into ohmic contact, whereby an increase in the driving voltage described above can be suppressed. Cr is desirably used as a second metal electrode 920 from the viewpoint of coming into ohmic contact with an n-type ITO layer. Portions of the second metal electrode 920 other than the surface to be brought into contact with an n-type ITO layer 918 may be made of Au.

The first metal electrode 921 is desirably made of a metallic material which comes into ohmic contact with the p-type AlGaAs layer 912 when brought into contact with the p-type AlGaAs layer 912. In the present embodiment, since the first metal electrode 921 and the second metal electrode 920 come into contact with different material layers, it is desirable to form the metal electrodes by different metals and make them come into ohmic contact.

As compared with the first embodiment, the n-type ITO layer 918 can be omitted in the present embodiment. Therefore, the present embodiment is desirable that resistance upon driving of the shift thyristor T can be reduced and an operating voltage of the shift thyristor T can be reduced.

In the present embodiment, a region in which the p-type AlGaAs layer 912 and the first metal electrode 921 of the shift thyristor T come into contact with each other may be included in a region in which the first metal electrode 921 of the shift thyristor T is formed. In particular, a region F in which the p-type AlGaAs layer 912 and the first metal electrode 921 of the shift thyristor T come into contact with each other is projected in the Z direction from right above the substrate 900 may be included in a region G in which the first metal electrode 921 of the shift thyristor T is projected in the Z direction.

With this configuration, in the present embodiment, a current concentration region can be formed in the shift thyristor T in the same manner as in the first embodiment. Since the first metal electrode 921 is formed so as to cover the current concentration region, light emitted from the shift thyristor T can be blocked by the first metal electrode 921. Therefore, unnecessary light emission from the shift thyristor T can be reduced, and contrast of the light-emitting element array can be improved.

In the shift thyristor T, a region in which the first metal electrode 921 and the p-type AlGaAs layer 912 come into contact with each other is desirably included on a surface (an upper surface) of the p-type AlGaAs layer 912 which is the uppermost layer of the semiconductor multilayer structure 938 on the side of the first metal electrode 921. That is, the region F described above is desirably included in a region H in which a surface (the upper surface) of the p-type AlGaAs layer 912 of the shift thyristor T on the side of the first metal electrode 921 is projected in the Z direction. With this configuration, reaching of a career implanted into the multilayer structure 930 from the first metal electrode 921 at side surfaces of the multilayer structure 930 can be suppressed, and stability of the characteristics of the shift thyristor can be improved.

Fourth Embodiment

Figure 13A:
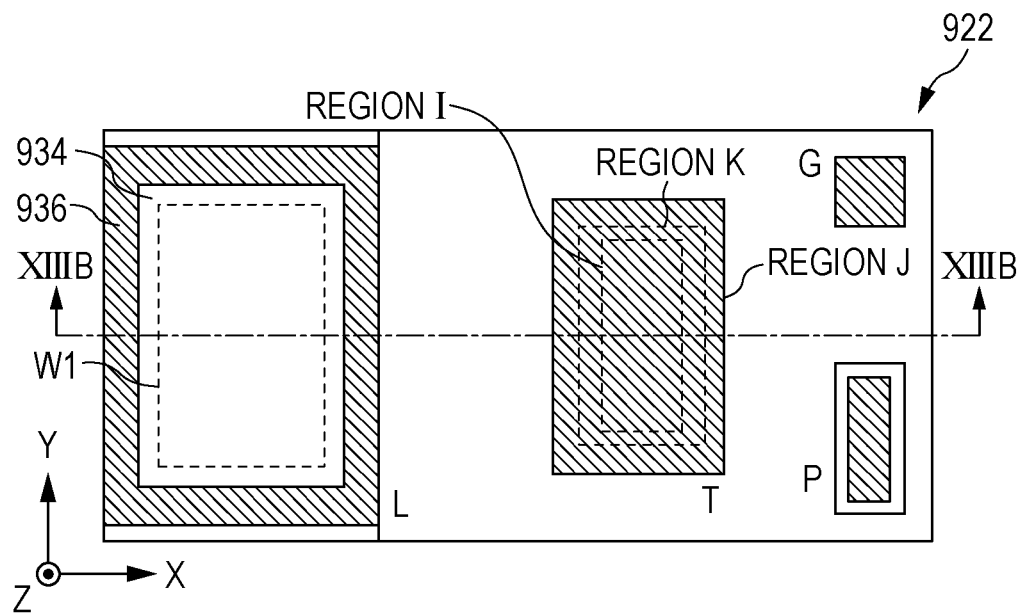
FIG. 13A schematically illustrates a part of a configuration of a light-emitting element array of a fourth embodiment.
Figure 13B:
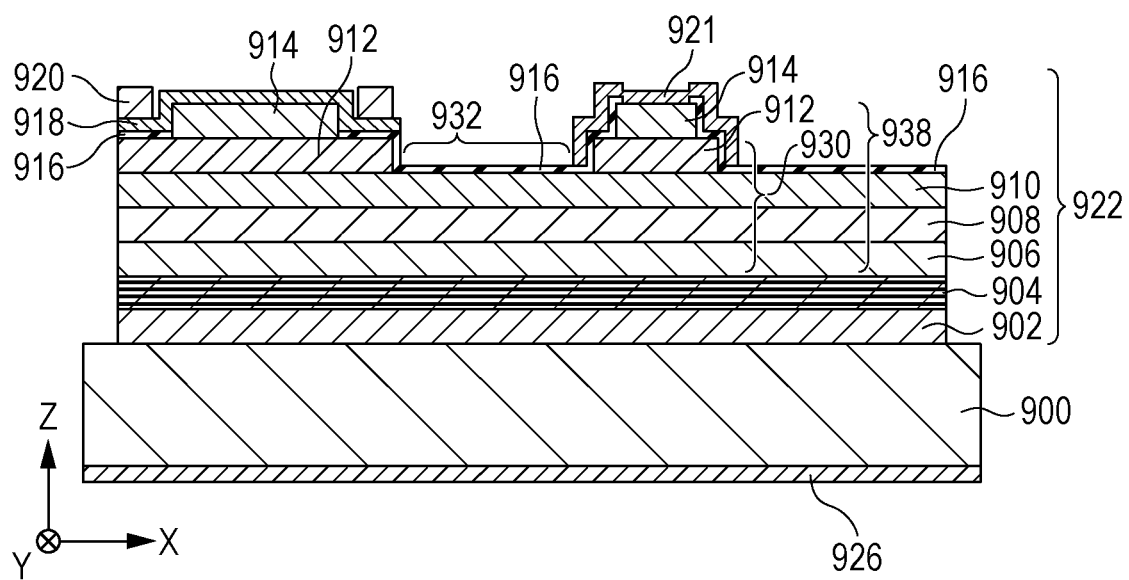
FIG. 13B is a cross-sectional view along line XIIIB-XIIIB of FIG. 13A.

A configuration of a light-emitting element array including a light-emitting element according to a fourth embodiment will be described with reference to FIGS. 13A and 13B. FIG. 13A is a plan view schematically illustrating a part of a configuration of the light-emitting element array of the present embodiment, and FIG. 13B is a cross-sectional view along line XIIIB-XIIIB of FIG. 13A. In the present embodiment, the same configurations as those of the first embodiment are denoted by the same reference numerals in FIGS. 13A and 13B, and detailed description thereof is omitted.

The present embodiment differs from the first embodiment in that a first metal electrode 921 is formed directly above a fifth semiconductor layer 914 in a shift thyristor T. That is, in the present embodiment, a first metal electrode 921 in contact with a fifth semiconductor layer 914 is disposed on the semiconductor multilayer structure 938.

Also in the present embodiment, a semiconductor multilayer structure 938 and the first metal electrode 921 desirably come into ohmic contact with each other in the shift thyristor T in the same manner as in the third embodiment, that is, the fifth semiconductor layer 914 and the first metal electrode 921 desirably come into ohmic contact. This can reduce a driving voltage of the shift thyristor T.

In the present embodiment, a region in which the first metal electrode 921 and the fifth semiconductor layer 914 of the shift thyristor T come into contact with each other may be included in a region in which the first metal electrode 921 of the shift thyristor T is formed. In particular, a region I in which the first metal electrode 921 and the fifth semiconductor layer 914 of the shift thyristor T come into contact with each other is projected in the Z direction from right above the substrate 900 may be included in a region J in which the first metal electrode 921 of the shift thyristor T is projected in the Z direction. In the shift thyristor T, the region in which the first metal electrode 921 and the semiconductor multilayer structure 938 come into contact with each other is desirably included in a plane of the uppermost layer of the semiconductor multilayer structure 938 on the side of the first metal electrode 921.

With this configuration, in the present embodiment, a current concentration region can be formed in the shift thyristor T in the same manner as in the first embodiment. Since the first metal electrode 921 is formed so as to cover the current concentration region, light emitted from the shift thyristor T can be blocked by the first metal electrode 921. Therefore, unnecessary light emission from the shift thyristor T can be reduced, and contrast of the light-emitting element array can be improved.

In the shift thyristor T, a region in which the fifth semiconductor layer 914 and the p-type AlGaAs layer 912 come into contact with each other is desirably included on a surface (an upper surface) of the p-type AlGaAs layer 912 on the side of the first metal electrode 921. The region I described above is desirably included in a region K in which a surface (the upper surface) of the p-type AlGaAs layer 912 of the shift thyristor T on the side of the first metal electrode 921 is projected in the Z direction. With this configuration, reaching of a career implanted into the multilayer structure 930 from the fifth semiconductor layer 914 at side surfaces of the multilayer structure 930 can be suppressed, and stability of the characteristics of the shift thyristor can be improved.

Fifth Embodiment

In a fifth embodiment, an exposure head 106 using the light-emitting element array according to the first embodiment will be described with reference to FIGS. 2A and 2B.

The exposure head of the present embodiment can be used suitably when exposing a photoconductor drum 102 and forming an electrostatic latent image on a photoconductor drum. However, usage of the exposure head 106 is not particularly limited, and may be used as a light source of a line scanner, for example.

The exposure head 106 includes a light-emitting element group 201 including a plurality of light-emitting element arrays, a printed substrate 202 on which the light-emitting element group 201 is mounted, and a rod lens array 203. The exposure head 106 further includes a housing (a support member) 204 which supports the rod lens array 203 and the printed substrate 202.

A plurality of light-emitting element arrays included in the light-emitting element group 201 is light-emitting element arrays of the first embodiment. The rod lens array 203 is a focus optical system which focuses light from the light-emitting element group 201.

The exposure head 106 of the present embodiment focuses light from the light-emitting element group 201 on the rod lens array 203. The light focuses on the rod lens array 203 is illuminated onto the photoconductor drum 102.

FIG. 2A illustrates an arrangement of the photoconductor drum 102 and the exposure head 106, and FIG. 2B illustrates a state in which the light from the exposure head is focused on a surface of the photoconductor drum 102. The exposure head 106 is disposed to face the photoconductor drum 102. The exposure head 106 and the photoconductor drum 102 are attached to an image formation apparatus respectively by an unillustrated attaching member.

It is desirable that the exposure head 106 is assembled and adjusted alone in a factory, and subject to focus adjustment and light quantity adjustment of each spot so that a light focusing position becomes appropriate when attached to an image formation apparatus. A distance between the photoconductor drum 102 and the rod lens array 203 and a distance between the rod lens array 203 and the light-emitting element group 201 are set to be predetermined distances. Therefore, the light from the exposure head 106 is focused on the photoconductor drum 102. Therefore, during focus adjustment, an attaching position of the rod lens array 203 is adjusted so that a distance between the rod lens array 203 and the light-emitting element group 201 becomes a desired distance. During light quantity adjustment, each light-emitting element is sequentially made to emit light, and a driving current of each light-emitting element is adjusted so that the light focused via the rod lens array 203 becomes a predetermined light quantity.

In the present embodiment, a light-emitting element array capable of reducing light emission from elements other than a light-emitting thyristor as a light-emitting element as compared with a related art technology is used as a light source of the exposure head. Therefore, an exposure head with higher contrast as compared with a related art technology can be obtained.

Sixth Embodiment

Figure 3:
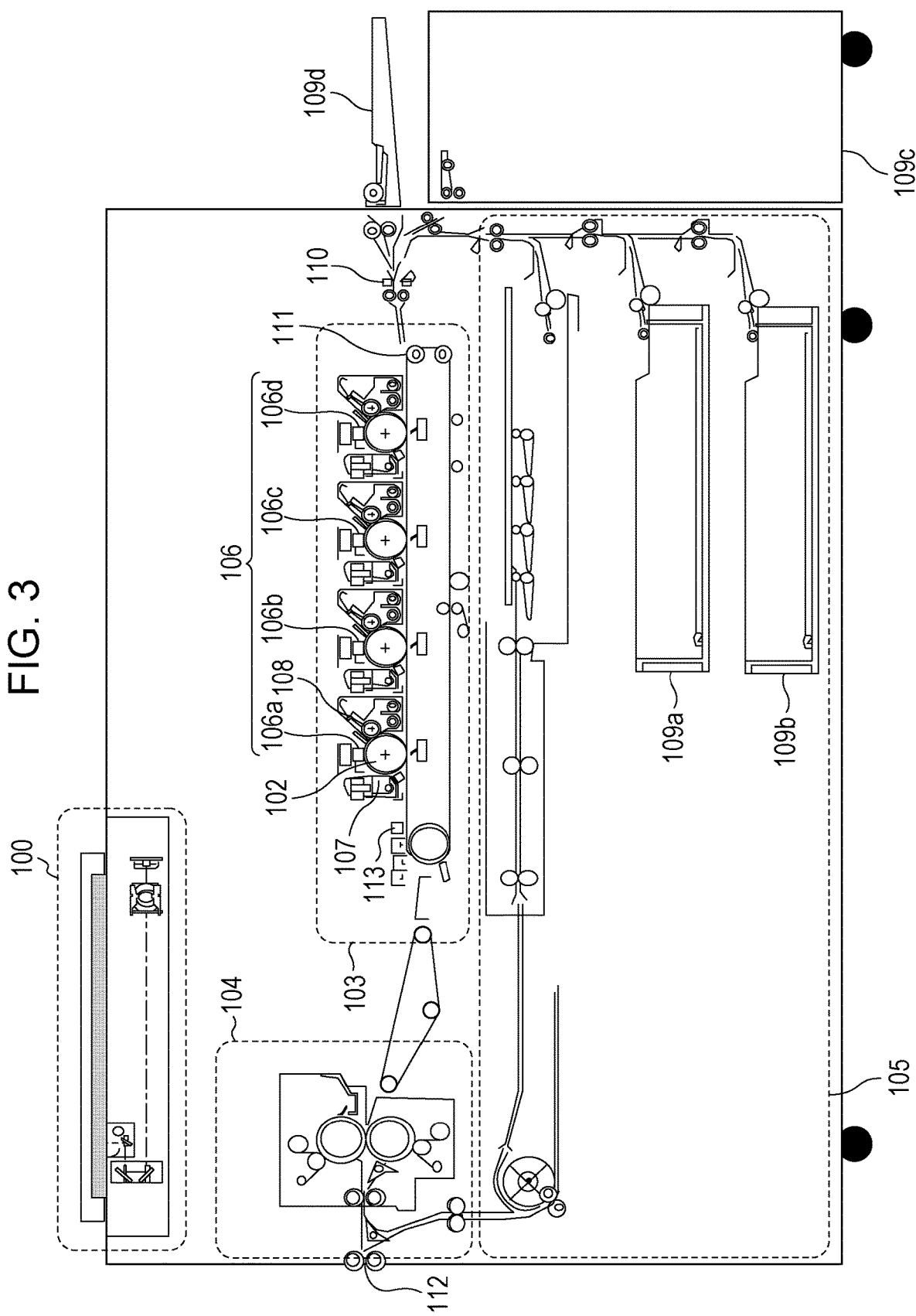
FIG. 3 schematically illustrates a configuration of an image formation apparatus according to a sixth embodiment.

In a sixth embodiment, an image formation apparatus using the exposure head using the light-emitting element array according to the first embodiment will be described with reference to FIG. 3. FIG. 3 schematically illustrates a configuration of the image formation apparatus according to the present embodiment.

The image formation apparatus of the present embodiment is an electrophotographic image forming apparatus and includes a scanner unit 100, an image forming unit 103, a fixing unit 104, a sheet feeding/conveyance unit 105, and an unillustrated control unit which controls these units.

The scanner unit 100 illuminates a document to be read, and optically reads an image of the document. By converting the image read by the scanner unit 100 into electrical signals, image data is generated.

The image forming unit 103 includes a plurality of developing units which develop an image using an electrophotographic process. Each of the developing units includes a photoconductor drum 102, an exposure head 106, a charging unit 107, and a developing unit 108. The development unit may be a process cartridge containing a configuration used for the development of a toner image. In that case, the process cartridge is desirably attachable to and removable from a main body of the image forming apparatus.

The photoconductor drum 102 is an image carrying member on which an electrostatic latent image is formed. The photoconductor drum 102 is driven to rotate, and is charged by the charging unit 107.

The exposure head 106 is the exposure head of the third embodiment, illuminates light in accordance with the image data onto the photoconductor drum 102, and forms an electrostatic latent image on the photoconductor drum 102. In particular, the exposure head 106 focuses the light generated from tip surfaces of the arranged light-emitting element arrays 201 on the photoconductor drum 102 by the rod lens array 203, and forms an electrostatic latent image in accordance with the image data on the photoconductor drum 102.

The developing unit 108 supplies toner (a developer) to the electrostatic latent image formed on the photoconductor drum 102 and develops the image. The toner is contained in a container. The container which contains the toner is desirably included in the developing unit. The developed toner image (a developer image) is transferred to a recording medium, such as a paper sheet, conveyed on a transfer belt 111.

The image formation apparatus of the present embodiment includes four developing units (development stations) which develop an image using such a series of electrophotographic processes, and forms a desired image by transferring a toner image from each developing unit. Four developing units have toners of different colors, and sequentially conduct image forming operations in magenta, yellow, and the black after predetermined time elapses from the start of the image forming operation in cyan.

The sheet feeding/conveyance unit 105 feeds a paper sheet from a previously instructed feeding unit from among feeding units in apparatus main body 109a and 109b, an external feeding unit 109c, and manual feeding unit 109d. The fed paper sheet is conveyed to a registration roller 110.

The registration roller 110 conveys the paper sheet onto the transfer belt 111 so that the toner image formed on the image forming unit 103 described above is transferred to the paper sheet.

An optical sensor 113 is disposed to face a surface of the transfer belt 111 to which the toner image is transferred, and position detection of a test chart printed on the transfer belt 111 is performed in order to derive an amount of color shift among developing units. The derived amount of color shift is sent to an unillustrated image controller unit and used to correct an image position of each color. With this control, a full color toner image which no color shift can be transferred to a paper sheet.

The fixing unit 104 includes a plurality of rollers and a heat source, such as a halogen heater, inside thereof. The fixing unit 104 dissolves and fixes with heat and pressure the toner on the paper sheet to which the toner image is transferred from the transfer belt 111, and discharges the paper sheet to the outside of the image formation apparatus with a discharge roller 112.

The unillustrated image formation control unit is connected with a multifunction peripheral (MFP) control unit which controls the entire MFP including the image formation apparatus, and executes control in accordance with instructions from the MFP control unit. The image formation control unit issues instructions so that the scanner unit 100, the image forming unit 103, the fixing unit 104, and the sheet feeding/conveyance unit 105 operate smoothly and in cooperation, while managing the state of these units.

If image formation is conducted using the light-emitting element array of above-described embodiment as an exposure head, the length of the light-emitting element array in the exposure head is determined in accordance with an image area width on the photoconductor drum, and a light-emitting element distance (a density in the light-emitting points) is determined in accordance with resolution. For example, if image formation is performed at resolution of 1200 dpi, a center-to-center distance of adjoining light-emitting elements among a plurality of light-emitting elements separated into the mesa structures 922 by the element separation grooves 924 is set to about 21.16 µm.

In an image formation apparatus using such an exposure head, the number of parts to be used is smaller as compared with an image formation apparatus employing a laser scanning system in which deflection scanning is conducted using a laser beam with a polygon motor. Therefore, reduction in size and cost is easy.

The image formation apparatus of the present embodiment uses an exposure head which includes a light-emitting element array capable of reducing light emission from elements other than a light-emitting thyristor as a light-emitting element as compared with a related art technology. Therefore, an image formation apparatus which forms a high-quality image using a high-contrast exposure head as compared with a related art technology can be obtained.

Embodiments of the present disclosure have been described but the present disclosure is not limited to the same. Various modifications and changes may be made without departing from the scope of the present disclosure.

For example, the light-emitting element array of the first embodiment is used as the light-emitting element array in the fifth embodiment and the sixth embodiment, however, the light-emitting element arrays of the second embodiments to the fourth embodiments may be used, or different light-emitting element arrays may be used in combination.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-167342 filed Aug. 29, 2016, No. 2016-237689 filed Dec. 7, 2016, No. 2016-254359 filed Dec. 27, 2016, and No. 2017-143688 filed Jul. 25, 2017, which are hereby incorporated by reference herein in their entirety.

What is claimed is:

1. A light-emitting element which includes, on a substrate, a shift thyristor and a light-emitting thyristor which is selected and becomes capable of emitting light by the shift thyristor,
    wherein the shift thyristor and the light-emitting thyristor each include a semiconductor multilayer structure including a first semiconductor layer of a first conductivity type, a second semiconductor layer of a second conductivity type which is different from the first conductivity type, a third semiconductor layer of the first conductivity type, and a fourth semiconductor layer of the second conductivity type in this order from the substrate side;
    wherein the shift thyristor includes a current diffusion layer having an area that is in contact with the semiconductor multilayer structure, and a first metal electrode in this order, or the first metal electrode having an area that is in contact with the semiconductor multilayer structure on the semiconductor multilayer structure;
    wherein in the shift thyristor, a first region in which the area of the current diffusion layer that is in contact with the semiconductor multilayer structure or the area of the first metal electrode that is in contact with the semiconductor multilayer structure is projected in a stacked direction of the semiconductor multilayer overlaps a second region in which the first metal electrode is projected in the stacked direction; and
    wherein an area of the second region defined as the entire portion of the first metal electrode is larger than an area of the first region.

2. The light-emitting element according to claim 1, wherein the first region is included in a plane of the uppermost layer of the semiconductor multilayer structure on the side of the first metal electrode.

3. The light-emitting element according to claim 1, wherein
    the light-emitting thyristor includes a light extraction region and a current supply region in a plan view;
    in the light extraction region, the light-emitting thyristor includes a fifth semiconductor layer of the second conductivity type and a transparent electrode layer of the first conductivity type in this order on the fourth semiconductor layer; and in the current supply region, the light-emitting thyristor includes the transparent electrode layer, an interlayer insulating layer, and a second metal electrode in this order, or the transparent electrode layer and the second metal electrode in this order on the fourth semiconductor layer.

4. The light-emitting element according to claim 3, wherein the fifth semiconductor layer and the transparent electrode layer form a tunnel junction.

5. The light-emitting element according to claim 3, wherein
the fifth semiconductor layer includes a high concentration region on a side of a surface which is in contact with the transparent electrode layer, and
impurity concentration in the high concentration region is equal to or greater than $1.5 \times 10^{19}$ cm$^{-3}$ and equal to or less than $2 \times 10^{20}$ cm$^{-3}$.

6. The light-emitting element according to claim 1, wherein the semiconductor multilayer structure includes a contact layer which is in contact with a surface opposite to the side of the substrate of the fourth semiconductor layer.

7. The light-emitting element according to claim 1, wherein the semiconductor multilayer structure and the first metal electrode come into ohmic contact with each other in the shift thyristor.

8. The light-emitting element according to claim 3, wherein the first metal electrode and the second metal electrode are made of mutually different metals.

9. The light-emitting element according to claim 1, wherein the first semiconductor layer, the second semiconductor layer, the third semiconductor layer, and the fourth semiconductor layer contain a GaAs-based material or an AlGaAs-based material.

10. The light-emitting element according to claim 1, wherein the first conductivity type is n type and the second conductivity type is p type.

11. The light-emitting element according to claim 10, wherein the substrate is an n-type semiconductor substrate.

12. A light-emitting element which includes, on a substrate, a shift thyristor and a light-emitting thyristor which is selected and becomes capable of emitting light by the shift thyristor,
wherein the shift thyristor and the light-emitting thyristor each include a multilayer structure including a first semiconductor layer of a first conductivity type, a second semiconductor layer of a second conductivity type which is different from the first conductivity type, a third semiconductor layer of the first conductivity type, and a fourth semiconductor layer of the second conductivity type in this order from the substrate side;

wherein the shift thyristor includes a metal electrode on the multilayer structure;
wherein at least one of the first semiconductor layer to the fourth semiconductor layer includes, in a plan view, a first region, and a second region which is disposed around the first region and of resistance is higher than that of the first region;
wherein the second region is formed in more than one layer of the multilayer structure;
wherein the light-emitting thyristor includes, on the substrate, a multilayer structure which is the same as the multilayer structure of the shift thyristor, a current diffusion layer, and an electrode, in this order from the substrate side; and
wherein the shift thyristor includes a current diffusion layer which is the same as the current diffusion layer of the light-emitting thyristor between a semiconductor layer which includes the first region and the second region among the first semiconductor layer and the fourth semiconductor layer and the metal electrode.

13. A light-emitting element array, comprising
a plurality of the light-emitting elements according to claim 1, wherein
light-emitting thyristors provided in each of the plurality of light-emitting elements are arranged unidimensionally.

14. An exposure head comprising:
the light-emitting element array according to claim 13; and
an optical system configured to focus light from the light-emitting element array.

15. An image formation apparatus, comprising:
an image carrying member;
a charging unit configured to charge a surface of the image carrying member;
an exposure head configured to expose the surface of the image carrying member charged by the charging unit, and form an electrostatic latent image on the surface of the image carrying member, wherein the exposure head includes the light-emitting element array according to claim 13;
a developing unit configured to develop the electrostatic latent image formed by the exposure head; and
a transfer unit configured to transfer an image developed by the developing unit to a recording medium.

16. The light-emitting element according to claim 1, wherein the semiconductor multilayer structure includes a projected portion and the first metal electrode is formed on a side surface of the projected portion.

17. The light-emitting element according to claim 1, wherein an outer edge of the first region is inside an inner edge of the second region.

* * * * *